(12) United States Patent
Kamee et al.

(10) Patent No.: US 8,801,204 B2
(45) Date of Patent: Aug. 12, 2014

(54) ILLUMINATION APPARATUS HAVING WAVELENGTH CONVERTER WITH PLURALITY OF FLUORESCENT MEMBERS

(71) Applicant: Olympus Corporation, Tokyo (JP)

(72) Inventors: Hiroyuki Kamee, Mitaka (JP); Takeshi Ito, Hino (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 13/674,381

(22) Filed: Nov. 12, 2012

(65) Prior Publication Data

US 2013/0088852 A1   Apr. 11, 2013

Related U.S. Application Data

(63) Continuation of application No. PCT/JP2011/056944, filed on Mar. 23, 2011.

(30) Foreign Application Priority Data

May 13, 2010   (JP) ................................. 2010-111308

(51) Int. Cl.
*F21V 9/16* (2006.01)
*F21Y 101/02* (2006.01)
(52) U.S. Cl.
CPC ............... *F21V 9/16* (2013.01); *F21Y 2101/02* (2013.01); *F21Y 2101/025* (2013.01)
USPC .......................................................... 362/84
(58) Field of Classification Search
None
See application file for complete search history.

(56) References Cited

U.S. PATENT DOCUMENTS

| | | | | |
|---|---|---|---|---|
| 7,758,224 B2 * | 7/2010 | Hama et al. | ................ | 362/555 |
| 8,197,111 B2 * | 6/2012 | Hama et al. | ................ | 362/555 |
| 2008/0089089 A1 | 4/2008 | Hama et al. | | |

FOREIGN PATENT DOCUMENTS

| | | |
|---|---|---|
| JP | 2008-004419 | 1/2008 |
| JP | 4197109 | 10/2008 |
| JP | 2008-270229 | 11/2008 |

OTHER PUBLICATIONS

International Search Report dated May 31, 2011 issued in PCT/JP2011/056944.
International Preliminary Report on Patentability PCT/JP2011/056944 dated Nov. 22, 2012, together with an English language translation.

* cited by examiner

*Primary Examiner* — Natalie Walford
(74) *Attorney, Agent, or Firm* — Scully, Scott, Murphy & Presser, P.C.

(57) ABSTRACT

The wavelength conversion member includes a plurality of fluorescent members that absorb the excitation light and emit fluorescent light having a peak wavelength different from the peak wavelength of the excitation light. The wavelength conversion member has a surface irradiated with excitation light that faces an excitation light emitting surface of the excitation light source. The optical axis passes the center of the surface irradiated with excitation light. The plurality of fluorescent members are arranged in a divisional manner at such proportions that a circumferential area ratio, which is defined as the ratio of area occupied by each of the fluorescent members in a concentric annular region having a center located at the center of the surface irradiated with excitation light on the surface irradiated with excitation light of the wavelength conversion member, is substantially constant irrespective of the radius of the concentric annular region.

26 Claims, 21 Drawing Sheets

ILLUMINATION APPARATUS HAVING WAVELENGTH CONVERTER WITH PLURALITY OF FLUORESCENT MEMBERS

CROSS-REFERENCE TO RELATED APPLICATION

The present application is based upon and claims the benefit of priority from the prior Japanese Patent Application No. 2010-111308 filed on May 13, 2010; the entire contents of which are incorporated herein by reference.

BACKGROUND OF THE INVENTION

1. Field of the Invention

The present invention relates to an illumination apparatus.

2. Description of the Related Art

Small size light sources that use an excitation light source and a fluorescent member in combination have been newly developed nowadays. In some of such light sources, a plurality of types of fluorescent members are used to create illumination light by mixing light emitted from the plurality of fluorescent members. For example, Patent Document 1 discloses, as shown in FIGS. 20 and 21, an illumination apparatus 910 as such that includes a light source 911 that emits excitation light and a plurality of fluorescent members 913, 914, 915, wherein the plurality of fluorescent members are arranged along a direction perpendicular to the direction of optical path of the excitation light. This illumination apparatus is intended to allow easy setting of color balance of a white light source and to improve the light conversion efficiency. FIG. 20 is a side view illustrating the construction of the illumination apparatus described in Patent Document 1. FIG. 21 is a plan view of the illumination apparatus shown in FIG. 20.

In conventional illumination apparatuses, if a plurality of fluorescent members are used in combination, light emitted from one fluorescent member is absorbed again by another fluorescent member, and the light conversion efficiency cannot be enhanced. In contrast, in the illumination apparatus described in Patent Document 1, since a plurality of fluorescent members are arranged along a direction perpendicular to the direction of the optical path of the excitation light, reabsorption in the optical path direction hardly occurs.

In the following description, the emission axis in which excitation light is emitted from the center point of the excitation light emitting area of a light source at the highest intensity will be referred to as the optical axis.

PRIOR ART DOCUMENT

Patent Document

Patent Document 1: Publication of Japanese Patent No. 4197109

SUMMARY OF THE INVENTION

Problem to be Solved by the Invention

Generally used light sources have a rotationally symmetric angular intensity distribution characteristics with a partial exception such as a shadow of a component. Therefore, as the light receiving angle is inclined or increased from a center axis of the emitted excitation light, the irradiation light intensity changes depending on the angle, but the light intensity does not change along a circumference at the same inclination angle. Many light sources have a central axis as described above unless a peculiar optical component is used, and the center axis coincides, in most cases, with the optical axis in which the intensity of the excitation light is highest in the angular intensity distribution. Therefore, in the illumination apparatus described in Patent Document 1, while fluorescent members disposed near the front position toward which light from the light source is mainly emitted are irradiated intensively with excitation light, the intensity of the excitation light having large inclination angles with which fluorescent members disposed remote from the front position are irradiated is low. In consequence, the color balance of light emitted from the fluorescent members does not directly reflect the proportions of the arrangement of the fluorescent members. Many light sources have such characteristics that a change in the intensity of the entire emitted light causes a change in the above-described angular intensity distribution. Therefore, in the illumination apparatus described in Patent Document 1, the color balance of emitted light varies depending on the light intensity of the excitation light with which the fluorescent members are irradiated. Consequently, the illumination apparatus described in Patent Document 1 requires further color balance adjustment.

The present invention has been made in view of the above described problem, and an object of the invention is to provide an illumination apparatus that allows easy adjustment of color balance. Furthermore, another object of the present invention is to enable easy setting of color balance in a white light source.

Means for Solving the Problem

To solve the above-described problems and achieve the object, an illumination apparatus according to the present invention comprises an excitation light source and a wavelength conversion member arranged in front of the excitation light source, wherein an optical axis is defined as a main emission axis of excitation light just before irradiating the wavelength conversion member, the wavelength conversion member comprises a plurality of fluorescent members that absorb the excitation light and emit fluorescent light having a peak wavelength different from the peak wavelength of the excitation light, the plurality of fluorescent members being disposed respectively in a plurality of divisional regions in the wavelength conversion member, the wavelength conversion member has a surface irradiated with excitation light that faces an excitation light emitting surface of the excitation light source, the optical axis passes the center of the surface irradiated with excitation light, and the plurality of fluorescent members are arranged in a divisional manner at such proportions that a circumferential area ratio, which is defined as the ratio of area occupied by each of the fluorescent members in a concentric annular region having a center located at the center of the surface irradiated with excitation light on the surface irradiated with excitation light of the wavelength conversion member, is substantially constant irrespective of a radius of the concentric annular region.

In the illumination apparatus according to the present invention, it is preferred that all interfaces between the adjacent fluorescent members be curved surfaces or flat surfaces that are constituted by aggregates of straight lines parallel to the optical axis.

In the illumination apparatus according to the present invention, it is preferred that the plurality of fluorescent members be arranged in a divisional manner partitioned by flat surfaces containing the optical axis and a curved surface constituted by an aggregate of straight lines parallel to and equidistant from the optical axis.

In the illumination apparatus according to the present invention, it is preferred that the plurality of fluorescent members be arranged in a divisional manner in such a way as to have two-fold or more rotational symmetry about the optical axis.

In the illumination apparatus according to the present invention, it is preferred that the wavelength conversion member be divided by cylindrical surfaces parallel to and concentric about the optical axis, and at least one of a plurality of annular divisional regions is formed by rotating about the optical axis.

In the illumination apparatus according to the present invention, it is preferred that at least one of a plurality of annular divisional regions is formed by rotating about the optical axis by 90 degrees or 180 degrees.

In the illumination apparatus according to the present invention, it is preferred that the wavelength conversion member have a function of reflecting fluorescent light emitted from the plurality of fluorescent members on an interface between the plurality of fluorescent members.

In the illumination apparatus according to the present invention, it is preferred that the wavelength conversion member have a metal reflecting film provided on each of the interfaces between the adjacent fluorescent members.

In the illumination apparatus according to the present invention, it is preferred that the wavelength conversion member have a thin film layer having a reflective index lower than the plurality of fluorescent members provided on each of the interfaces between the adjacent fluorescent members.

In the illumination apparatus according to the present invention, it is preferred that the wavelength conversion member have a dielectric multi-layer film provided on each of the interfaces between the adjacent fluorescent members.

Advantageous Effect of the Invention

The illumination apparatus according to the present invention is advantageous in that color balance can be set easily.

DETAILED DESCRIPTION OF THE INVENTION

In the following, embodiments of the illumination apparatus according to the present invention will be described in detail with reference to the drawings. It should be understood that the present invention is not limited by the embodiments described in the following.

(First Embodiment)
[Construction]

Figure 1:
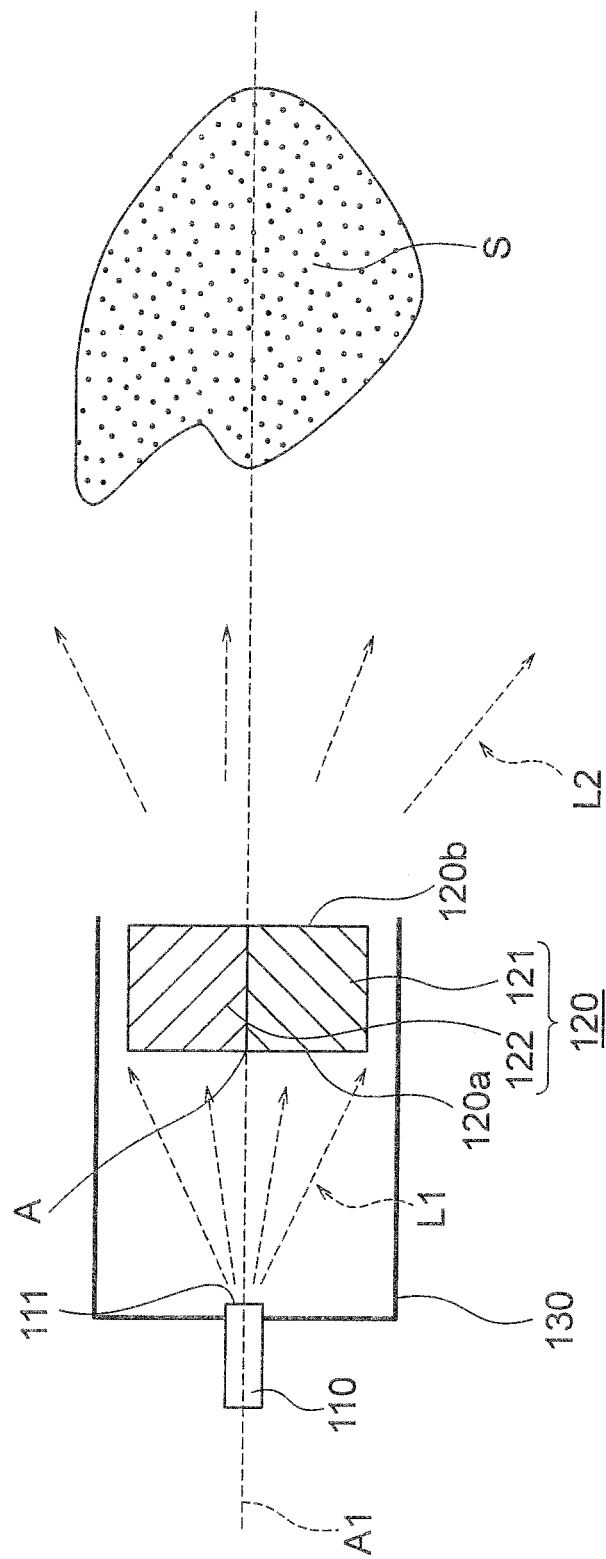
FIG. 1 is a cross sectional view of an illumination apparatus according to a first embodiment, taken on a plane containing the optical axis of excitation light.
Figure 2:
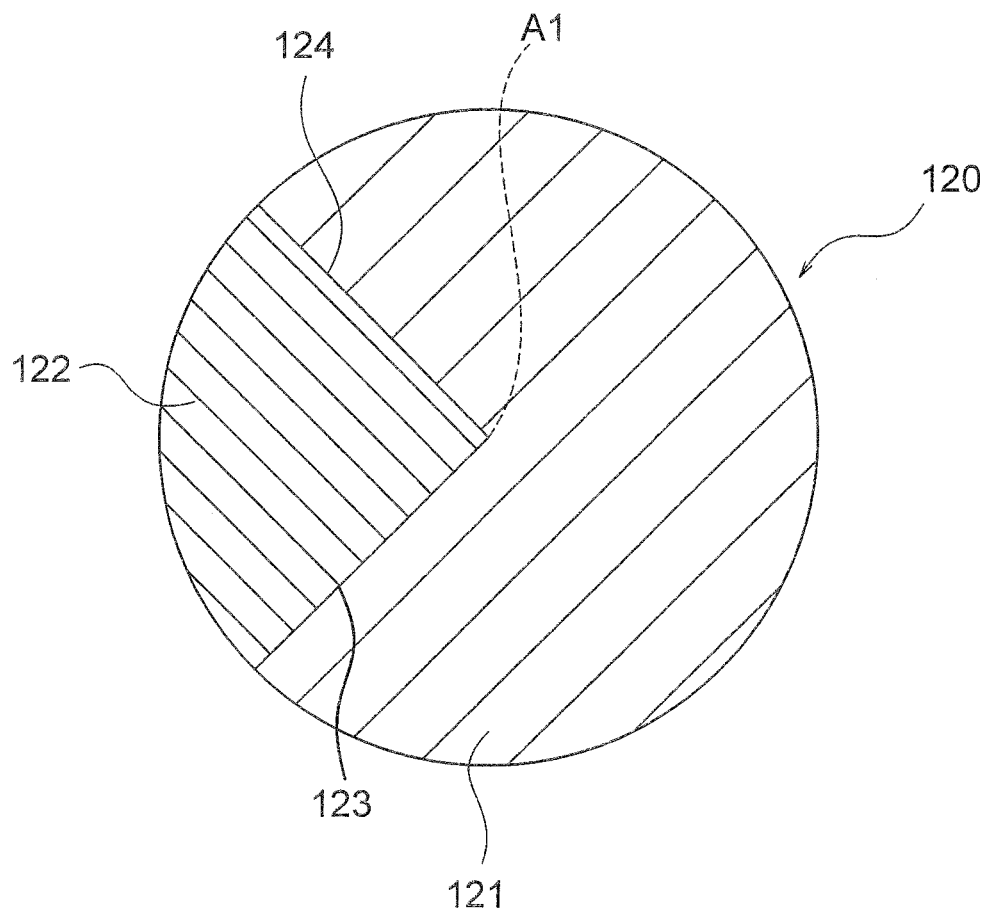
FIG. 2 is a cross sectional view of a wavelength conversion member according to the first embodiment, taken on an arbitrary plane perpendicular to the optical axis.
Figure 3:
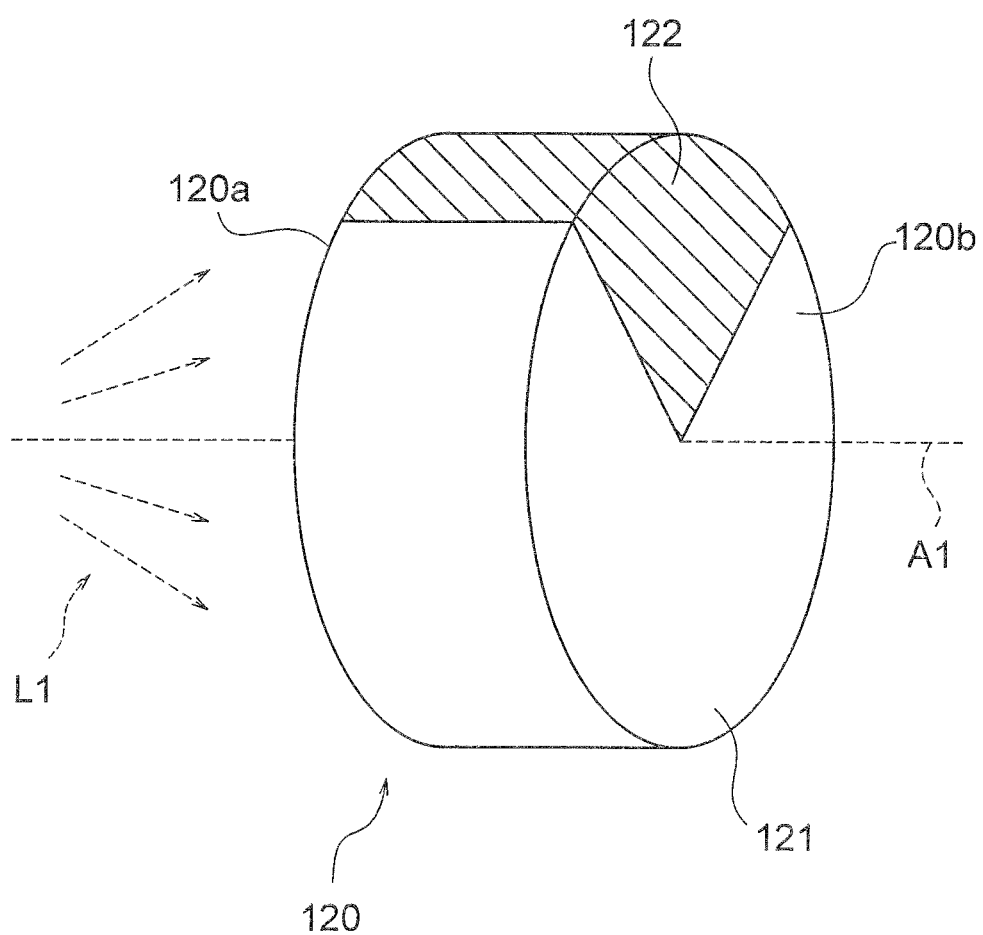
FIG. 3 is a perspective view showing the construction of the wavelength conversion member according to the first embodiment.

An illumination apparatus according to a first embodiment will be described with reference to FIGS. 1, 2, and 3. FIG. 1 is a cross sectional view of the illumination apparatus according to the first embodiment, taken on a plane containing the optical axis A1 of the excitation light L1. FIG. 2 is a cross sectional view of a wavelength conversion member 120, taken on an arbitrary plane perpendicular to the optical axis A1. FIG. 3 is a perspective view showing the construction of the wavelength conversion member 120.

In the first embodiment, an excitation light source 110 and a wavelength conversion member 120 are held by a fixing member 130, as shown in FIG. 1. The wavelength conversion member 120 is disposed in front (with respect to the direction in which light is emitted from the excitation light source 110) of the excitation light source 110. The excitation light source 110 and the wavelength conversion member 120 are arranged in such a way that a first surface (surface irradiated with excitation light) 120a of the wavelength conversion member 120 is irradiated with excitation light L1 emitted from the excitation light source 110.

Here, the direction in which light is emitted from the center point of an excitation light emitting area (excitation light emitting surface) 111 of the excitation light source 110 at the highest intensity will be referred to as the optical axis A1. The optical axis A1 is a main emission axis of excitation light just before irradiating the wavelength conversion member 120. The center of the surface irradiated with excitation light is on the optical axis A1.

The wavelength conversion member 120 has an cylindrical shape, and the center axis of the cylinder or the straight line passing the centers of a first surface 120a and a second surface 120b, which are upper and lower flat circular surfaces, coincides with the optical axis A1 of the excitation light. Among the surfaces of the wavelength conversion member 120, the first surface 120a, which is a flat circular surface facing the light emitting area 111 of the excitation light source 110, is a flat surface perpendicular to the optical axis A1 of the excitation light L1 and has a circular shape having a center at a point on the optical axis A1. The second surface 120b, which is a flat circular surface opposed to the first surface 120a, is also a flat surface perpendicular to the optical axis A1 of the excitation light L1 and has a circular shape having a center at a point on the optical axis A1.

The wavelength conversion member 120 is made up of two types of fluorescent members including a first fluorescent member 121 and a second fluorescent member 122, which are arranged in a divisional manner. The dividing surfaces (or interfaces) 123, 124 between the first fluorescent member 121 and the second fluorescent member 122 are two flat surfaces containing the optical axis A1 of the excitation light L1 and forming an angle of 90 degrees therebetween at the optical axis A1. The dividing surfaces 123, 124 are aggregates of straight lines parallel to the optical axis A1. The second fluorescent member 122 is a block that is left when the first fluorescent member 121 is removed from the wavelength conversion member 120.

With the above-described divisional arrangement of the first fluorescent member 121 and the second fluorescent member 122, the occupied area ratio of the first fluorescent member 121 to the second fluorescent member 122 on the first surface 120a of the wavelength conversion member 120 is given by the following equation (1):

(occupied area ratio of first fluorescent member 121 to second fluorescent member 122)=(area occupied by first fluorescent member 121 on first surface 120a)/(area occupied by second fluorescent member 122 on first surface 120a)=3 (1)

Here, the "circumferential area ratio" is defined for the fluorescent members on the first surface of the wavelength conversion member. Specifically, the circumferential area ratio at distance r is defined as the ratio of the sums of the lengths of the circular arcs as the segments of a circle consisting of points at distance r from the center point A of the circular first surface 120a contained within the respective fluorescent members 121, 122.

In the case of the first embodiment, the wavelength conversion member 120 is divided by two dividing surfaces 123, 124, which are two flat surfaces containing the optical axis A1, which is the center axis of its cylindrical shape, to include two fluorescent members 121, 122. In consequence, the circumferential area ratio is constant irrespective of the distance from the center point A of the circle of the first surface 120a, and the following equation (2) follows from the above equation (1)

(circumferential area ratio of first fluorescent member 121 to second fluorescent member 122)=(occupied area ratio of first fluorescent member 121 to second fluorescent member 122)=3 (2).

Generally used light sources have a rotationally symmetric angular intensity distribution characteristics with a partial exception such as a shadow of a component. Therefore, as the tilt angle is increased from the center axis of the excitation light, the irradiation light intensity changes depending on the angle, but the emitted light intensity does not change along a circumference at the same inclination angle. Many light sources have a central axis as described above unless a peculiar optical component is used, and the center axis coincides, in most cases, with the optical axis in which the intensity of the excitation light is highest in the angular intensity distribution. Many light sources have such characteristics that a change in the intensity of the entire emitted light causes a change in the above-described angular intensity distribution.

In the first embodiment, the above-described features are adopted with the light source having the above-described angular intensity distribution characteristics. In consequence, although the excitation light source 110 has angular intensity distribution characteristics, the ratio of the intensities of excitation light with which the respective fluorescent members are irradiated can be made equal to the ratio of the areas of the respective fluorescent members on the first surface 120a.

Specifically, since the circumferential area ratio of the first fluorescent member 121 is 3 as specified in the above equation (2), the intensity of the excitation light with which the first fluorescent member 121 in entirely is irradiated is three times the intensity of the excitation light with which the second fluorescent member 122 in entirety is irradiated. This ratio does not change even if the angular intensity distribution of the excitation light L1 changes.

The fluorescent members 121, 122 that constitute the wavelength conversion member 120 is a transparent member containing dispersed fluorescent particles. When irradiated with excitation light, the fluorescent particles absorb, characteristically, at least a portion of the excitation light and emit fluorescent light having a peak wavelength longer than the wavelength of the excitation light.

Fluorescent particles dispersed in the first fluorescent member 121 will be referred to as first fluorescent particles, fluorescent particles dispersed in the second fluorescent member 122 will be referred to as second fluorescent particles, and fluorescent light generated by the first fluorescent particles will be referred to as first fluorescent light, and fluorescent light generated by the second fluorescent particles will be referred to as second fluorescent light. The first fluorescent light and the second fluorescent light both have wavelengths within the visible wavelength range, and the first fluorescent light has a shorter peak wavelength than the second fluorescent light.

The excitation light L1 emitted from the excitation light source 110 has angular intensity distribution characteristics about the optical axis A1 as described above. The first surface 120a of the wavelength conversion member 120 is irradiated with the excitation light L1 emitted from the emitting area 111 of the excitation light source 110. The excitation light L1 entering into the wavelength conversion member 120 is incident on fluorescent particles dispersed in the respective fluorescent members 121, 122, so that the excitation light is partly diffused and partly absorbed. A portion of the absorbed excitation light is converted in the fluorescent particles into heat, and the remaining portion is converted into fluorescent light and emitted from the fluorescent members. A portion of the excitation light diffused by fluorescent particles is also incident on other fluorescent particles, and similar energy conversion occurs therein. This flow of energy occurs repeatedly as long as the light stays in the wavelength conversion member 120. The light emitted from the surfaces of the wavelength conversion member 120 includes the excitation light, the first fluorescent light, and the second fluorescent light. A portion of the fluorescent light is delivered as effective illumination light L2 to an illuminated object S.

The diameter and the thickness of the wavelength conversion member 120 and the dispersion concentration of each kind of fluorescent particles contained in the wavelength conversion member 120 are determined according to the design principle as to how much excitation light is to be transmitted. The apparatus according to the first embodiment is designed in such a way that the proportions in the intensity of light with which the illuminated object S is illuminated are such that the proportion of the excitation light is substantially zero, the proportion of the first fluorescent light is approximately 50%, and the proportion of the second fluorescent light is approximately 50%. In order to substantially prevent the excitation light from illuminating the illuminated object S, it is necessary that the wavelength conversion member 120 have a sufficiently large diameter or that the dispersion concentration of the fluorescent particles in the first and second fluorescent members 121, 122 be sufficiently high. However, if the diameter of the wavelength conversion member 120 is excessively large and/or if the dispersion concentration of the fluorescent particles is excessively high, the intensity of the fluorescent light will become low due to self absorption property of the fluorescent members, leading to insufficient intensity of the illumination light emitted to the illuminated object S. Therefore, the diameter of the wavelength conversion member 120 and the dispersion concentration of the fluorescent particles be set to appropriate values. The self absorption property mentioned above is the property that fluorescent light emitted from one fluorescent particle is absorbed again by another fluorescent particle of the same type and partly converted into heat.

Now, the shape of the wavelength conversion member 120 and the dispersion concentrations of the first fluorescent member 121 and the second fluorescent member 122 will be described with exemplary values.

First, the shape of the first surface 120a of the wavelength conversion member 120 is determined based on the angular intensity distribution characteristics of the excitation light source 110. As described before, since generally used light sources have rotationally symmetric angular intensity distribution characteristics, it is preferred that the first surface 120a has a circular shape conformed with the angular intensity distribution characteristics. This is because the shape of the first surface 120a conformed with the angular intensity distribution characteristics of the excitation light source 110 will minimize the fugitive excitation light and the self absorption, so that expected color balance can be achieved. This allows easy designing.

In a case described here, the first fluorescent particles were dispersed in transparent resin at a concentration of 50 wt % in the first fluorescent member 121 of the cylindrical wavelength conversion member 120, and the second fluorescent particles were dispersed in transparent resin at a concentration of 10 wt % in the second fluorescent member 122.

As a result, the light emission efficiency rate per unit volume of the first fluorescent member 121 to the second fluorescent member 122 was as follows:

(light emission efficiency rate of first fluorescent member 121 to second fluorescent member 122)=(light emission efficiency of first fluorescent member 121)/(light emission efficiency of second fluorescent member 122)=⅓ (3).

The emission ratio or the proportion of the first fluorescent light in the entire fluorescent light emitted from the wavelength conversion member 120 according to the first embodiment is given by the following equation (4) derived from the above equations (2) and (3), because the intensity ratio of excitation light with which the first fluorescent member is irradiated is equal to the ratio of the area of the first fluorescent member on the first surface 122a.

(emission ratio of first fluorescent member 121)=(circumferential area ratio of first fluorescent member 121 to second fluorescent member 122)×(light emission efficiency rate of first fluorescent member 121 to second fluorescent member 122)÷2=3×(⅓)÷2=½ (4)

In consequence, the energy of the first fluorescent light emitted from the wavelength conversion member 120 and the energy of the second fluorescent member emitted from the wavelength conversion member 120 are approximately equal to each other. Therefore, the illumination light L2 emitted toward the illuminated object S is mixed light in which the energy of the first fluorescent light and the energy of the second fluorescent light are approximately equal to each other.

It is preferred that the excitation light source 110 include a light emitting diode, a discharge lamp, or a semiconductor laser and that a lens, a fiber, a reflection plate and other optical components be used in combination with the light source. A plurality of excitation light sources that are suitable for use with the respective fluorescent members may be used taking into account the excitation characteristics of the plurality of fluorescent members used in the wavelength conversion member 120. When this is the case, it is preferred that an optical component such as a dielectric multilayer film or a star coupler be used so that the optical axes of the plurality of excitation light sources are arranged close to each other.

The fixing member 130 fixes the excitation light source 110 and the wavelength conversion member 120 in such a way that the relative position of them will not change and that illumination light L2 is emitted stably toward the illuminated object S. It is preferred that the fixing member 130 be made of a metal or a plastic. Since the fluorescent member partly generates heat when emitting light, it is preferred that the fixing member 130 have a certain degree of heat resistance.

Figure 4:
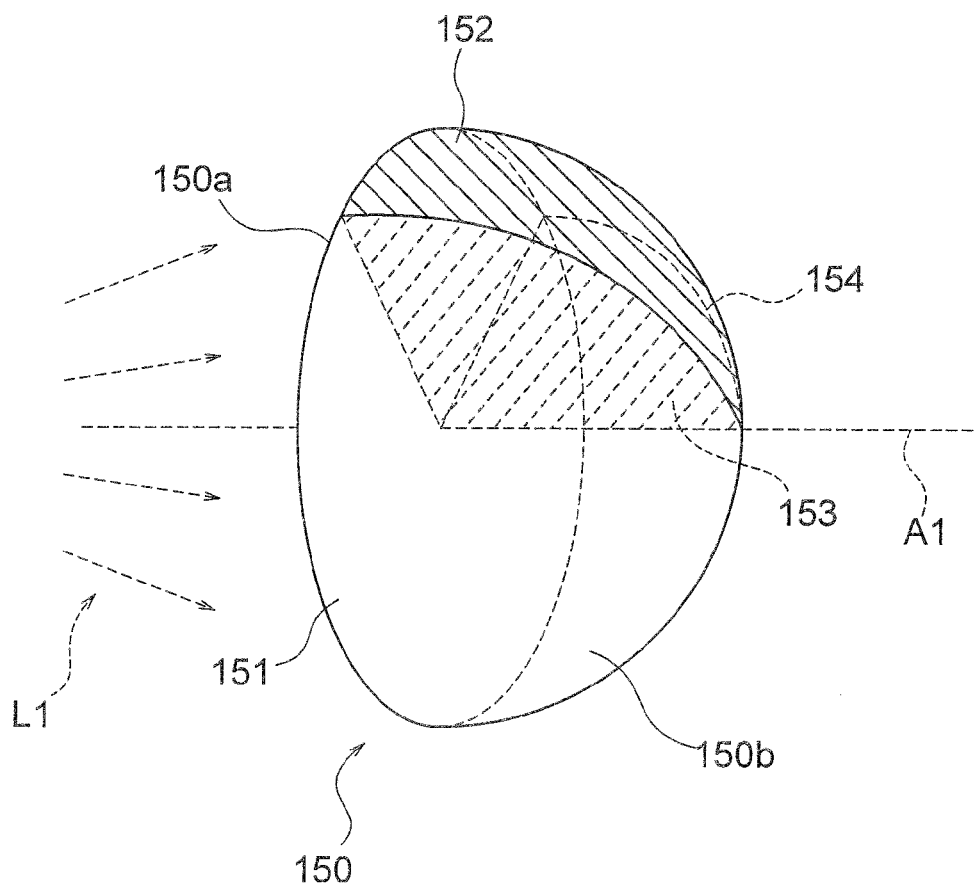
FIG. 4 is a perspective view showing the construction of a wavelength conversion member according to a first modification of the first embodiment.
Figure 5:
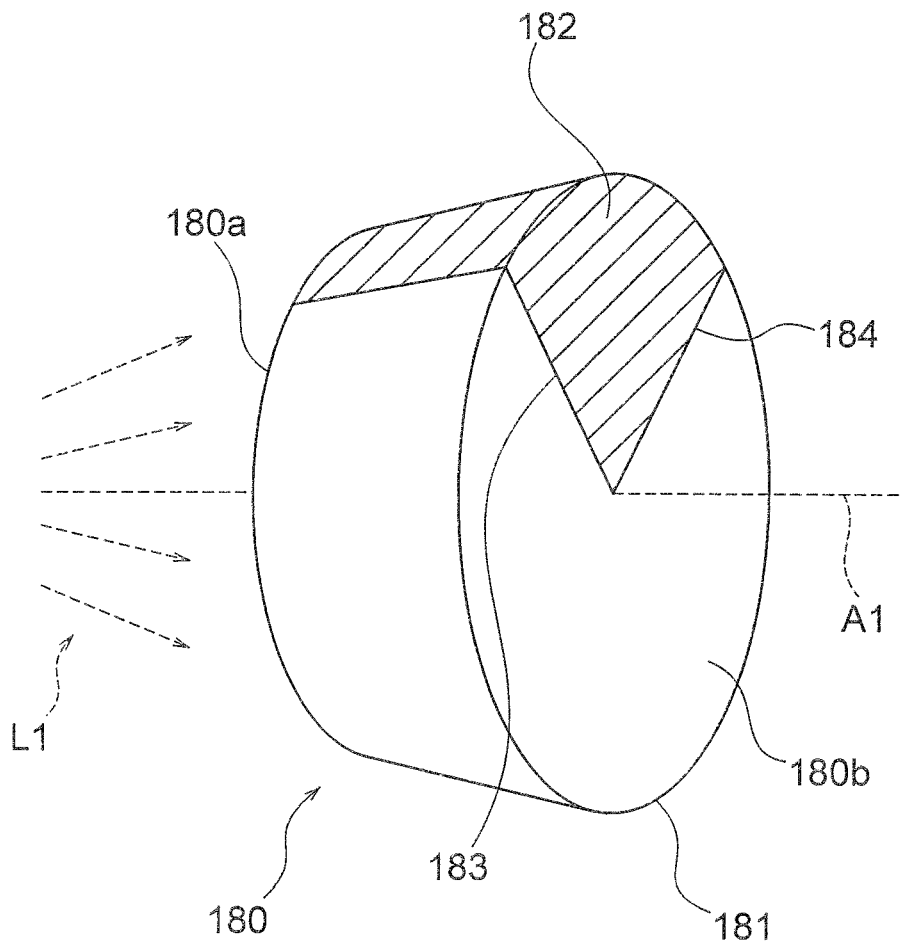
FIG. 5 is a perspective view showing the construction of a wavelength conversion member according to a second modification of the first embodiment.

In the above-described case, the wavelength conversion member 120 has a cylindrical shape, the shape thereof is not limited to a cylindrical shape, but it may have other shapes. For example, the wavelength conversion member 120 may have a dome-like shape shown in FIG. 4 or a truncated conical shape shown in FIG. 5 in order to have a circular surface irradiated with excitation light. FIG. 4 is a perspective view showing the construction of a wavelength conversion member 150 according to a first modification of the first embodiment. FIG. 5 is a perspective view showing the construction of a wavelength conversion member 180 according to a second modification of the first embodiment.

The wavelength conversion member 150 of the first modification is made up of a first fluorescent member 151 and a second fluorescent member 152, which are arranged in a divisional manner. The first fluorescent member 151 and the second fluorescent member 152 are transparent members in which fluorescent particles are dispersed, as with the first fluorescent member 121 and the second fluorescent member 122 of the wavelength conversion member 120. The type and the dispersion concentration of the fluorescent particles are the same as those in the first fluorescent member 121 and the second fluorescent member 122. As with the first fluorescent member 121 and the second fluorescent member 122, the dividing surfaces (or interfaces) 153, 154 between the first fluorescent member 151 and the second fluorescent member 152 are two flat surfaces containing the optical axis A1 of the excitation light L1 and forming an angle of 90 degrees therebetween at the optical axis A1. The dividing surfaces 153, 154 are aggregates of straight lines parallel to the optical axis A1. The second fluorescent member 152 is a block that is left when the first fluorescent member 151 is removed from the wavelength conversion member 150. In the wavelength conversion member 150, a flat, circular first surface (surface irradiated with excitation light) 150a is irradiated with excitation light L1, and light emitted mainly from a hemispherical second surface 150b illuminates an illuminated object S.

The wavelength conversion member 180 of the second modification is made up of a first fluorescent member 181 and a second fluorescent member 182, which are arranged in a divisional manner. The first fluorescent member 181 and the second fluorescent member 182 are transparent members in which fluorescent particles are dispersed, as with the first fluorescent member 121 and the second fluorescent member 122 of the wavelength conversion member 120. The type and the dispersion concentration of the fluorescent particles are the same as those in the first fluorescent member 121 and the second fluorescent member 122. As with the first fluorescent member 121 and the second fluorescent member 122, the dividing surfaces (or interfaces) 183, 184 between the first fluorescent member 181 and the second fluorescent member 182 are two flat surfaces containing the optical axis A1 of the excitation light L1 and forming an angle of 90 degrees therebetween at the optical axis A1. The dividing surfaces 183, 184 are aggregates of straight lines parallel to the optical axis A1. The second fluorescent member 182 is a block that is left when the first fluorescent member 181 is removed from the wavelength conversion member 180. In the wavelength conversion member 180, a flat, circular first surface (surface irradiated with excitation light) 180a is irradiated with excitation light L1, and light illuminating the illuminated object S is mainly emitted from a second surface 180b opposed to the first surface 180a and having a diameter larger than the first surface 180a.

[Advantageous Effect]

In the first embodiment and its modifications, the ratio of the intensity of the light emitted from the first fluorescent members 121, 151, 181 and the intensity of the light emitted from the second fluorescent members 122, 152, 182 is equal to the product of the light emission efficiency rates per unit volume of the respective fluorescent members and the circumferential area ratio on the first surface (surface irradiated with excitation light) 120a, 150a, 180a. Since these two parameters are stable against various disturbance factors, illumination light with good color balance can be provided, and the designing of color balance is made easier. Although in many light sources a change in the emitted light intensity leads to a change in the angular intensity distribution, stable illumination light with good color balance can be provided even with such light sources.

Specifically, as the fluorescent members are arranged on the first surface 120a, 150a, 180a in such a way that their circumferential area ratio is constant irrespective of the radial position, the color balance can be set only based on the light emission efficiency rates per unit area of the respective fluorescent members and the ratio of the areas of the respective fluorescent members on the first surface. Therefore, the designing of color balance is made easier.

A large part of the excitation light L1 is converted into fluorescent light in the vicinity of the first surface 120a, 150a, 180a, and thereafter the excitation light intensity decreases exponentially along the thickness direction of the fluorescent member (i.e. the direction along the optical axis A1). Therefore, a sufficient advantage is provided by specifying the way of setting the areas on the first surface.

The interfaces between the fluorescent members in the wavelength conversion member 120, 150, 180 are all arranged parallel to the optical axis A1 of the excitation light A1. In consequence, the area ratio of the fluorescent members in the wavelength conversion member 120, 150, 180 is the same on any plane perpendicular to the optical axis A1. Therefore, the excitation light traveling concentrically in the wavelength conversion member is converted into corresponding fluorescent light at the same ratio. This design makes the designing of color balance easier.

Figure 6:
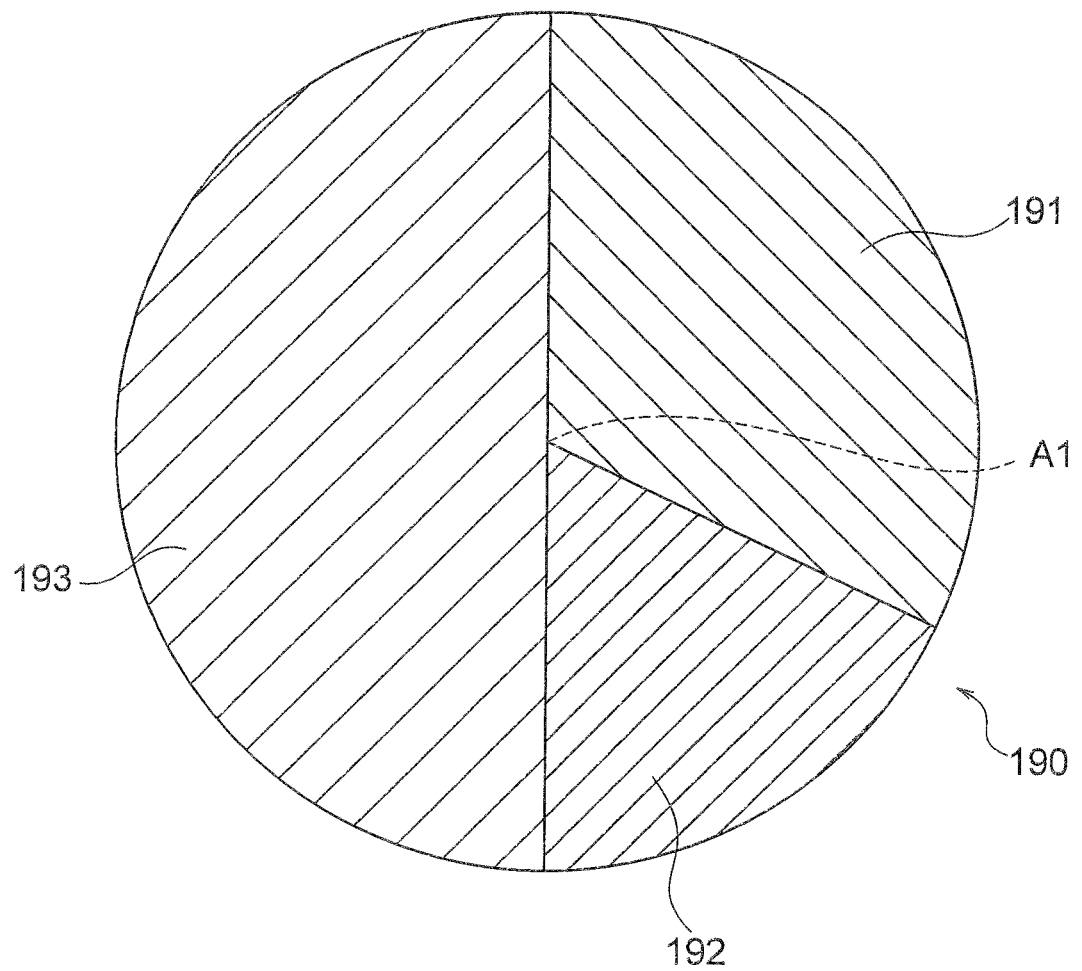
FIG. 6 is a plan view showing the construction of a wavelength conversion member according to a third modification of the first embodiment.

The number of colors of fluorescent light emitted from the wavelength conversion member 120, 150, 180 is not necessarily limited to two. For example, as shown in FIG. 6, fluorescent members corresponding to three or more colors may be arranged in conformity with the wavelength characteristics of illumination light to be emitted. FIG. 6 is a plan view showing the construction of the wavelength conversion member according to a third modification of the first embodiment.

The wavelength conversion member 190 is made up of a first fluorescent member 191, a second fluorescent member 192, and a third fluorescent member 193, which are arranged in a divisional manner. The first fluorescent member 191, the second fluorescent member 12, and the third fluorescent member 193 emit fluorescent light of different colors toward the illuminated object S when the excitation light L1 is incident on them. The dividing surface between the first fluorescent member 191 and the second fluorescent member 192, the dividing surface between the second fluorescent member 192 and the third fluorescent member 193, and the dividing surface between the first fluorescent member 191 and the third fluorescent member 193 are flat surfaces containing the optical axis A1 of the excitation light L1. The dividing surfaces are aggregates of straight lines parallel to the optical axis A1.

(Second Embodiment)

[Construction]

Figure 7:
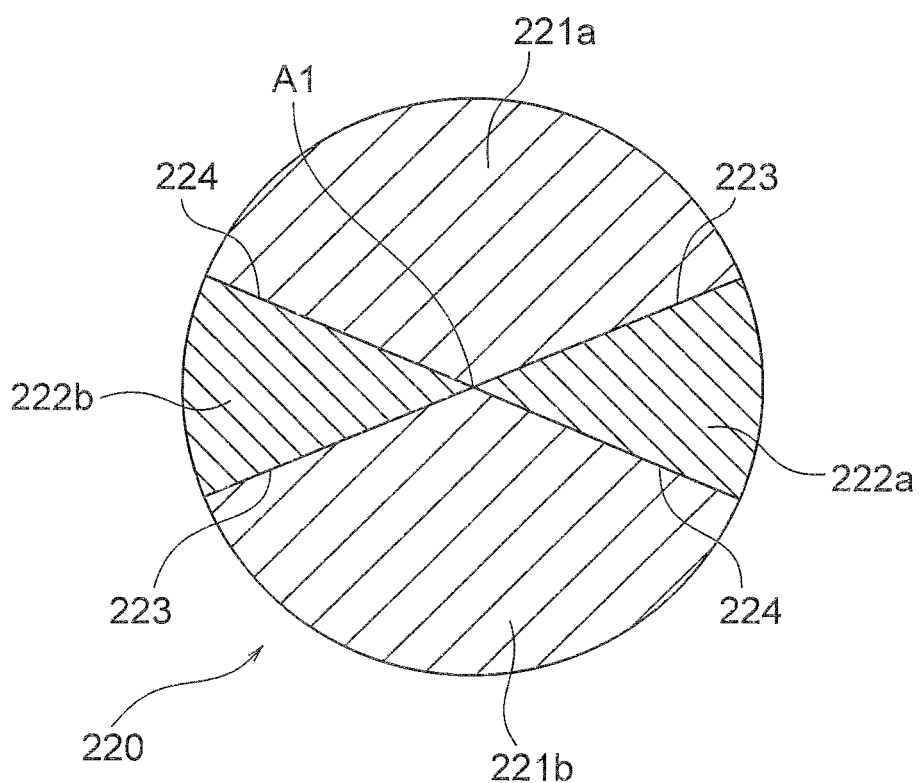
FIG. 7 is a cross sectional view of a wavelength conversion member according to a second embodiment, taken on an arbitrary plane perpendicular to the optical axis.
Figure 8:
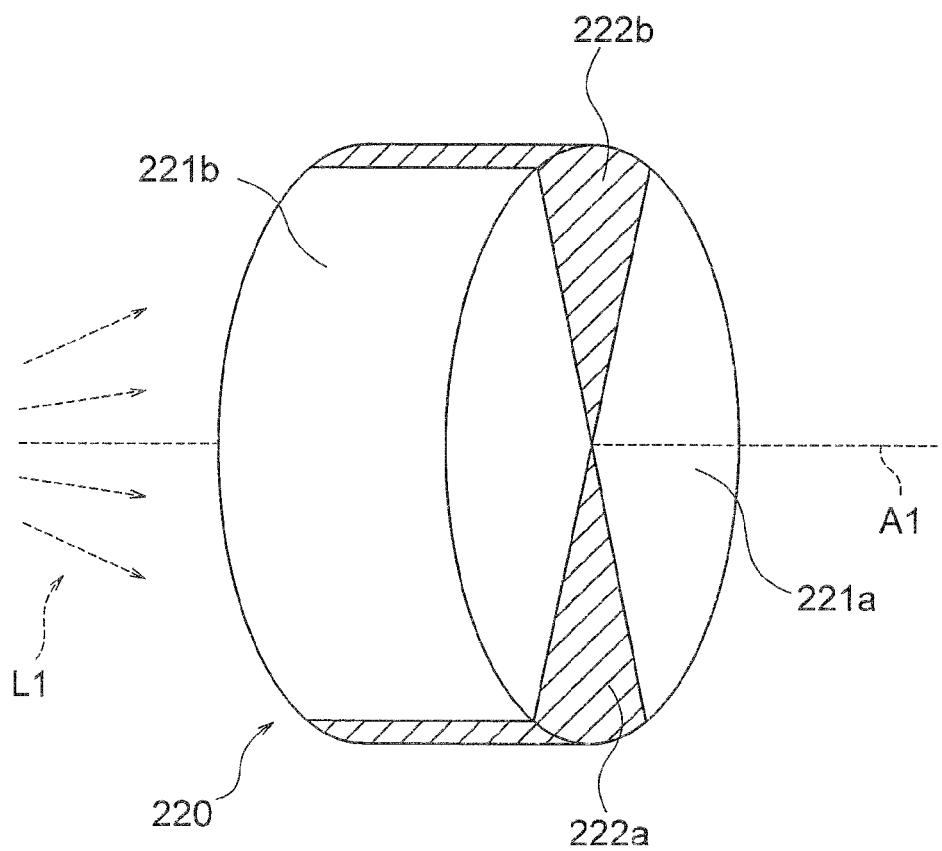
FIG. 8 is a perspective view showing the construction of the wavelength conversion member according to the second embodiment.

An illumination apparatus according to a second embodiment will be described with reference to FIGS. 7 and 8. FIG. 7 is a cross sectional view of a wavelength conversion member 220 according to the second embodiment, taken on an arbitrary plane perpendicular to the optical axis A1. FIG. 8 is a perspective view showing the construction of the wavelength conversion member 220 according to the second embodiment. In the following, portions different from those in the illumination apparatus according to the first embodiment will be described, and similar portions will not be described.

In the wavelength conversion member 220 according to the second embodiment, a first fluorescent member 221a, a second fluorescent member 222a, a first fluorescent member 221b, and a second fluorescent member 222b are arranged in a rotationally symmetric manner about the optical axis A1.

The interface between the first fluorescent member 221a and the second fluorescent member 222a and the interface between the first fluorescent member 221b and the second fluorescent member 222b constitute a common first interface 223. The interface between the first fluorescent member 221b and the second fluorescent member 222a and the interface between the first fluorescent member 221a and the second fluorescent member 222b constitute a common second interface 224. The first interface 223 and the second interface 224 are two planes that intersect on the optical axis A1 at an angle of 45 degrees. The first interface 223 and the second interface 224 are aggregates of straight lines parallel to the optical axis A1.

The first fluorescent members 221a and 221b have the same construction and are made of a transparent material in which fluorescent particles are dispersed, as with the first fluorescent member 121 in the first embodiment. The second fluorescent members 222a and 222b have the same construction and are made of a transparent material in which fluorescent particles are dispersed, as with the second fluorescent member 122 in the first embodiment.

[Operation]

As described above, with the above-described divisional arrangement of the first fluorescent members 221a, 221b and the second fluorescent members 222a, 222b divided by the first interface 223 and the second interface 224, the first fluorescent members and the second fluorescent members are divided into four regions in twofold rotational symmetry about the optical axis A1.

[Advantageous Effects]

With the above-described construction, the illumination apparatus according to the second embodiment can provide illumination light with good color balance, as with the illumination apparatus according to the first embodiment. Moreover, the above-described construction can reduce color variation (or parallax) of illumination light.

The color variation (parallax) mentioned here is the phenomenon that when an object S is illuminated by light, the color of the illumination light varies depending on the position on the illuminated object S to prevent the illuminated object S from being observed in correct color. In cases where the wavelength conversion member is made up of a plurality of fluorescent members that emit lights of different wavelengths, it is desirable that the lights emitted from them be mixed completely. To this end, it is desirable that the lights emitted from the same location on the wavelength conversion member have the same angular intensity distribution.

In the illumination apparatus according to the second embodiment, since the fluorescent members are arranged in a rotationally symmetric manner, the centers of light emission of the fluorescent members are precisely coincide with each other. In regard to the angular intensity distribution, since fluorescent members generally have isotropic fluorescent light emission characteristics, the first fluorescent member and the second fluorescent member emit light toward the illuminated object in the same angular intensity distribution. Thus, color variation (parallax) can be made small.

Figure 9:
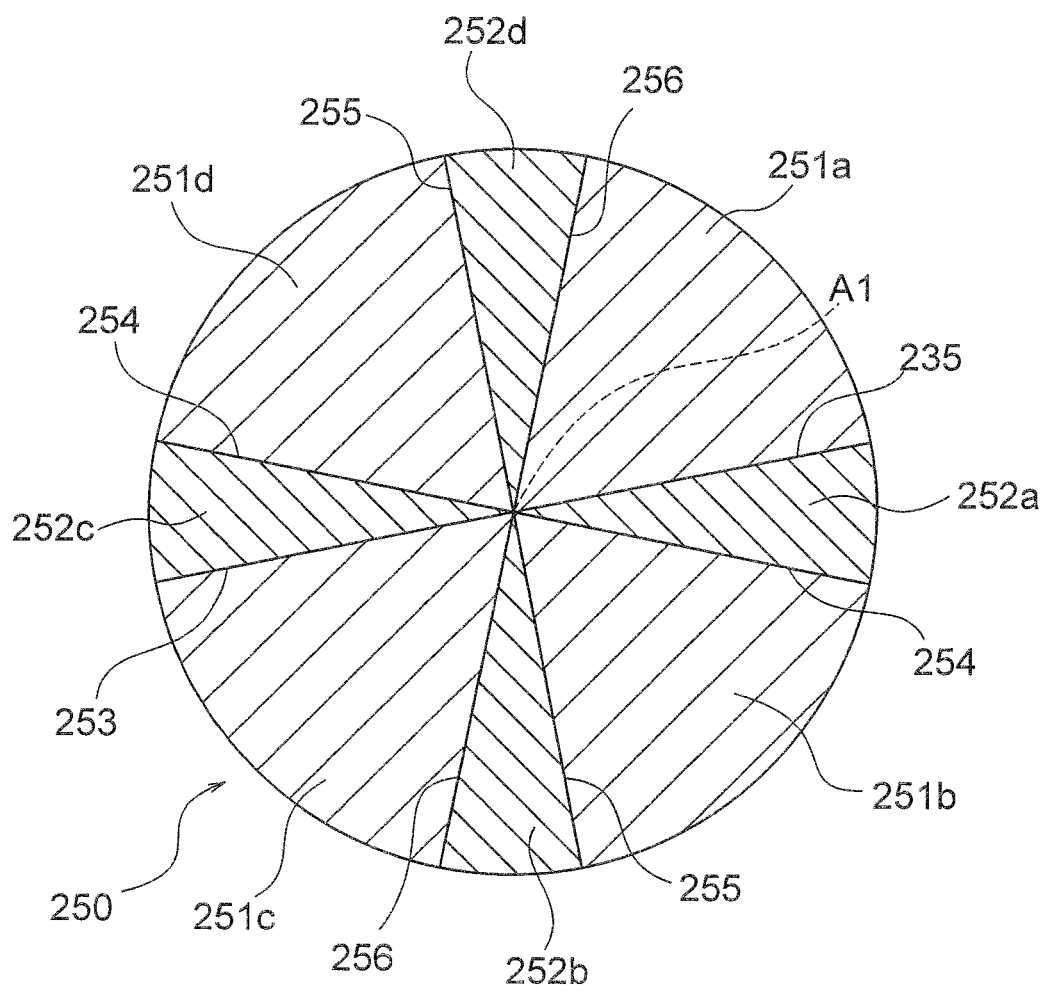
FIG. 9 is a plan view showing the construction of a wavelength conversion member according to a first modification of the second embodiment.

While the wavelength conversion member according to the second embodiment is divided into four regions, it may be divided into more than four regions. As an example, FIG. 9 schematically shows a wavelength conversion member divided into eight regions. FIG. 9 is a plan view showing the construction of a wavelength conversion member 250 according to a first modification of the second embodiment.

In the wavelength conversion member 250 according to the first modification of the second embodiment, a first fluorescent member 251a, a second fluorescent member 252a, a first fluorescent member 251b, a second fluorescent member 252b, a first fluorescent member 251c, a second fluorescent member 252c, a first fluorescent member 251d, and a second fluorescent member 252d are arranged in a rotationally symmetric manner about the optical axis A1. Thus, the wavelength conversion member 250 has four-fold rotational symmetry about the optical axis A1.

The interface between the first fluorescent member 251a and the second fluorescent member 252a and the interface between the first fluorescent member 251c and the second fluorescent member 252c constitute a common first interface 253. The interface between the first fluorescent member 251b and the second fluorescent member 252a and the interface between the first fluorescent member 251d and the second fluorescent member 252c constitute a common second interface 254. The interface between the first fluorescent member 251b and the second fluorescent member 252b and the interface between the first fluorescent member 251d and the second fluorescent member 252d constitute a common third interface 255. The interface between the first fluorescent member 251c and the second fluorescent member 252b and the interface between the first fluorescent member 251a and the second fluorescent member 252d constitute a common fourth interface 256.

The first interface 253 and the second interface 254 are two planes that intersect on the optical axis A1 at an angle of 22.5 degrees. Similarly, the third interface 255 and the fourth interface 256 are two planes that intersect on the optical axis A1 at an angle of 22.5 degrees.

The first fluorescent members 251a, 251b, 251c, and 251d have the same construction and are made of a transparent material in which fluorescent particles are dispersed, as with the first fluorescent member 121 in the first embodiment. The second fluorescent members 252a, 252b, 252c, and 252d have the same construction and are made of a transparent material in which fluorescent particles are dispersed, as with the second fluorescent member 122 in the first embodiment.

The wavelength conversion member 250 shown in FIG. 9 is divided into sections smaller than those in the wavelength conversion member 220 according to the second embodiment, which is divided into four sections. In consequence, not only the center of light emission of the first fluorescent members and that of the second fluorescent members coincide precisely with each other, but also color variation (parallax) can be made further smaller.

Figure 10:
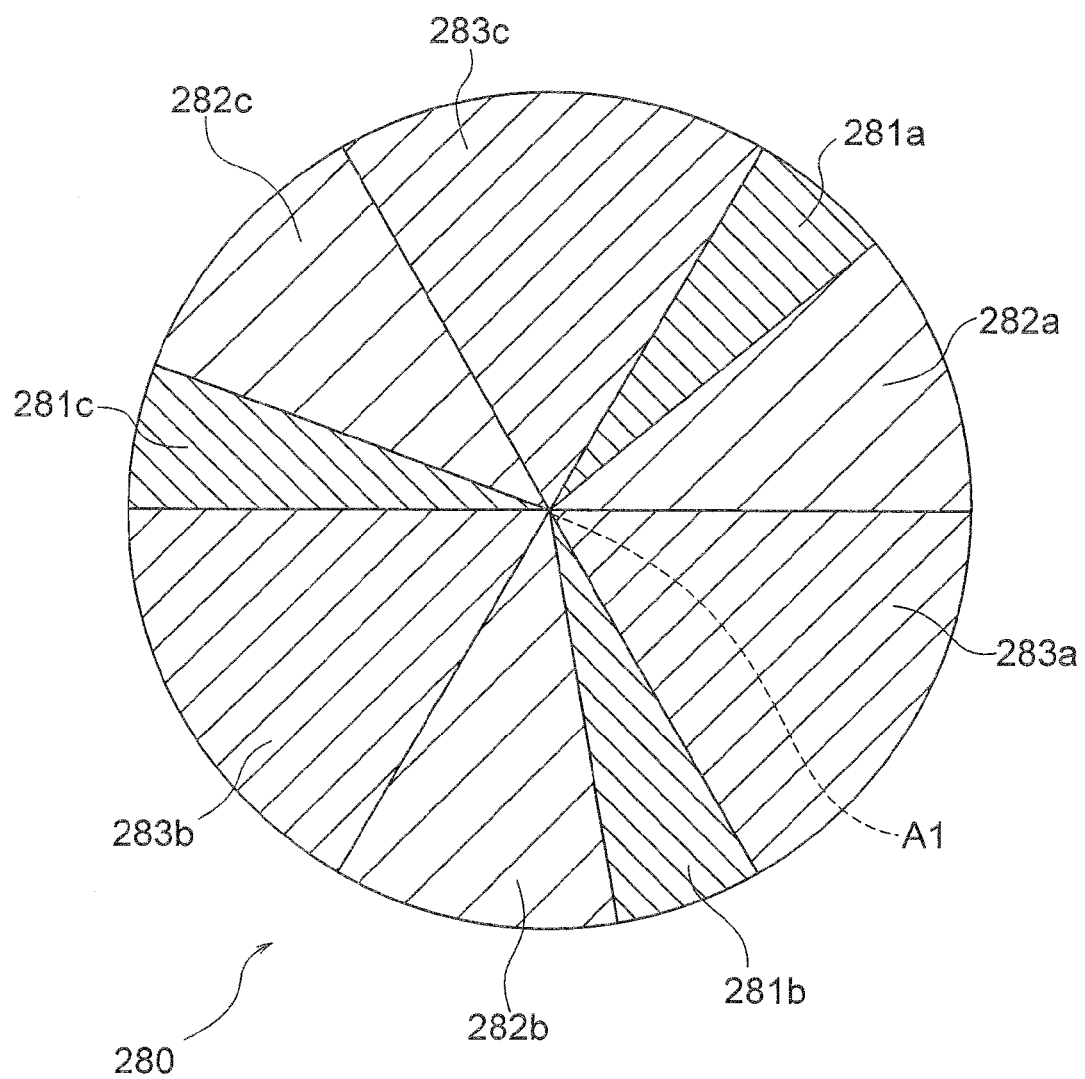
FIG. 10 is a plan view showing the construction of a wavelength conversion member according to a second modification of the second embodiment.

The number of colors of fluorescent light emitted from the wavelength conversion member 220 or the wavelength conversion member 250 is not necessarily limited to two. For example, as shown in FIG. 10, fluorescent members corresponding to three or more colors may be arranged in conformity with the wavelength characteristics of illumination light to be emitted. FIG. 10 is a plan view showing the construction of the wavelength conversion member 280 according to a second modification of the second embodiment.

The wavelength conversion member 180 is made up of first fluorescent members 281a, 281b, 281c, second fluorescent members 282a, 282b, 282c, and third fluorescent members 283a, 283b, 283c, which are arranged in a divisional manner. The first fluorescent members 281a, 281b, 281c, the second fluorescent members 282a, 282b, 282c, and the third fluorescent members 283a, 283b, 283c emit fluorescent light of different colors toward the illuminated object S when the excitation light L1 is incident on them. The dividing surfaces between the fluorescent members are flat surfaces containing the optical axis A1 of the excitation light L1. The dividing surfaces are aggregates of straight lines parallel to the optical axis A1. The first fluorescent members 281a, 281b, 281c, the second fluorescent members 282a, 282b, 282c, and the third fluorescent members 283a, 283b, 283c are blocks that are arranged in a rotational symmetric manner about the optical axis A1. Thus, the wavelength conversion member 280 has three-fold rotational symmetry about the optical axis A1.

The constructions, operations and advantages of the illumination apparatus according to the second embodiment other than described above are the same as those of the first embodiment.

Figure 11:
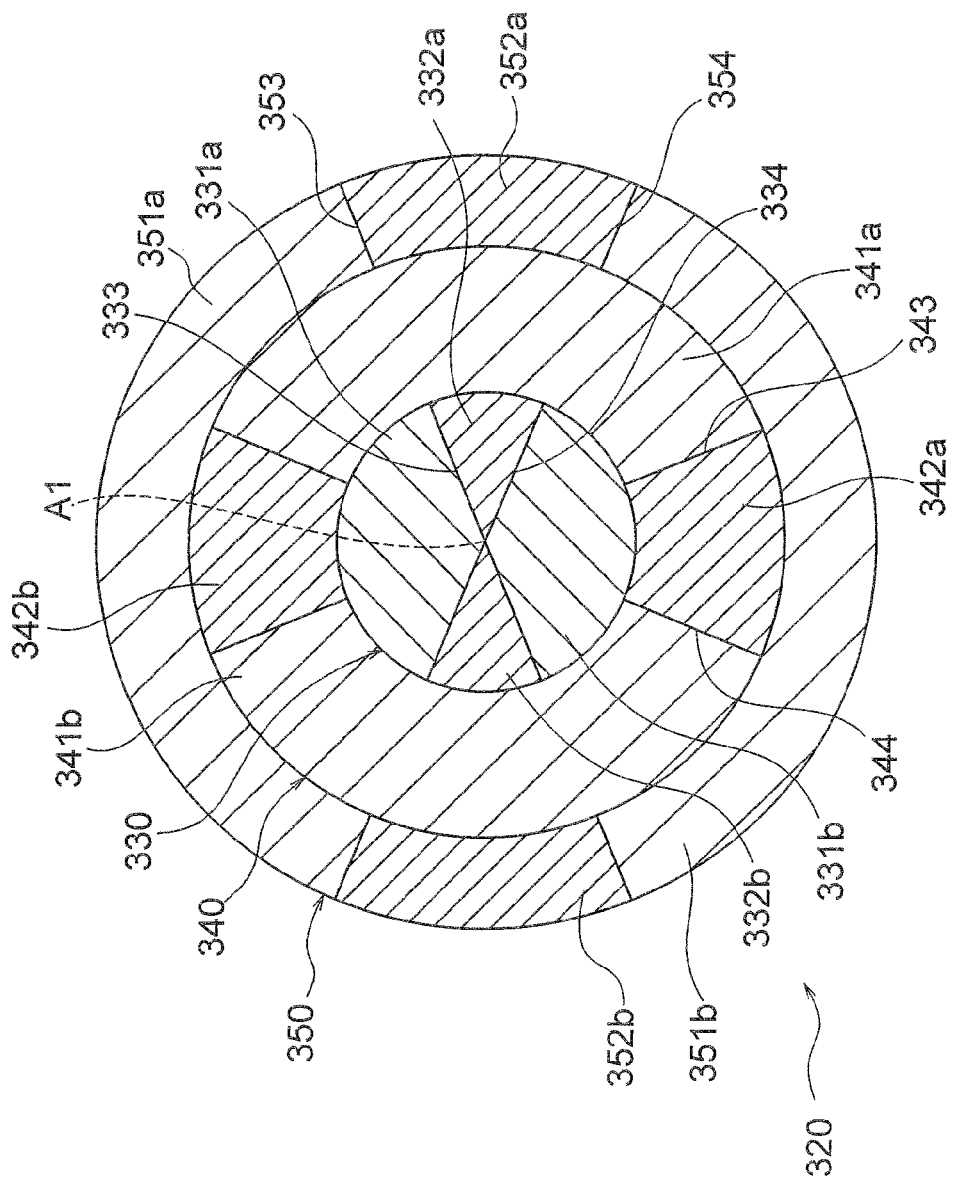
FIG. 11 is a cross sectional view of a wavelength conversion member according to a third embodiment, taken on an arbitrary plane perpendicular to the optical axis.
Figure 12:
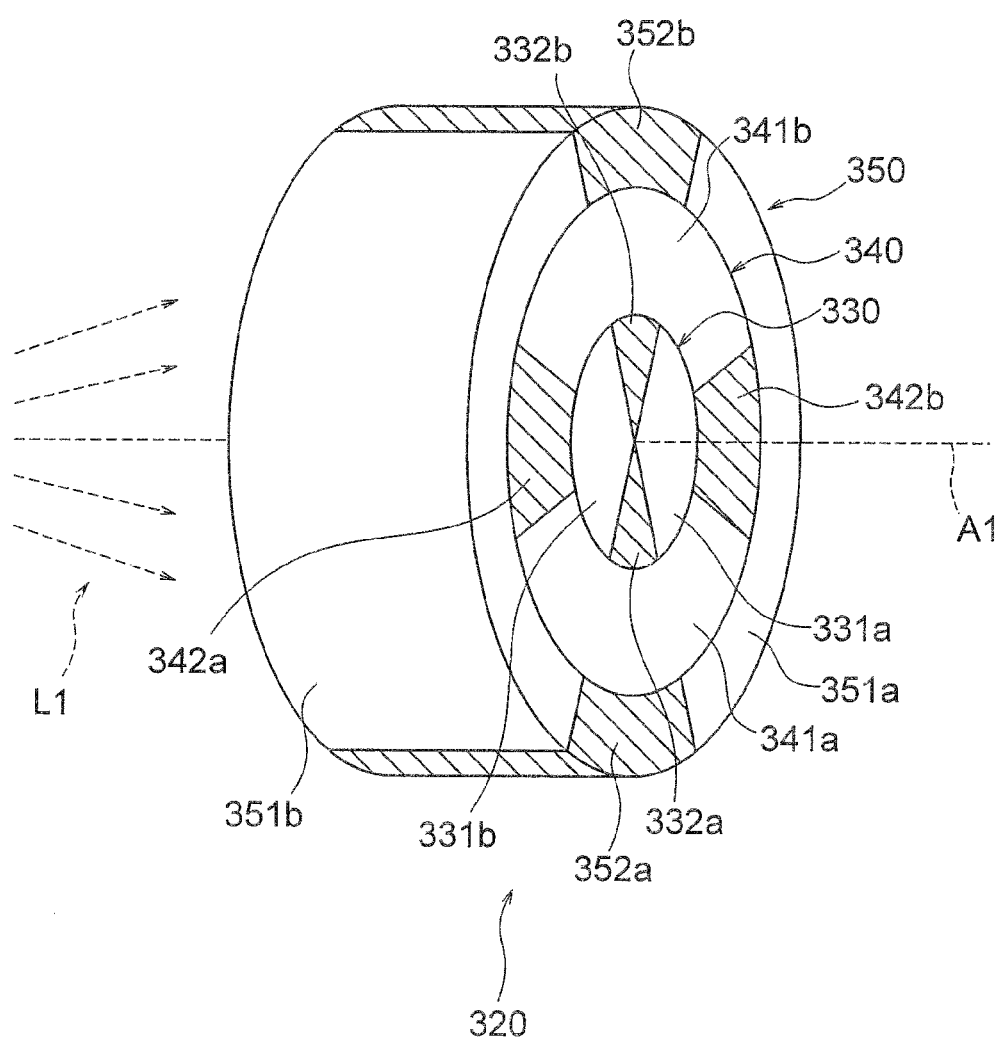
FIG. 12 is a perspective view showing the construction of the wavelength conversion member according to the third embodiment.

(Third Embodiment)
[Construction]
An illumination apparatus according to a third embodiment will be described with reference to FIGS. 11 and 12. FIG. 11 is a cross sectional view of a wavelength conversion member 320 according to the third embodiment, taken on an arbitrary plane perpendicular to the optical axis A1. FIG. 12 is a perspective view showing the construction of the wavelength conversion member 320 according to the third embodiment. In the following, portions different from those in the illumination apparatus according to the first embodiment will be described, and similar portions will not be described.

The wavelength conversion member 320 according to the third embodiment has three concentric annular regions 330, 340, 350 having a center located at the center of the surface irradiated with excitation light existing on the optical axis A1. Each of the annular regions is divided into four by dividing surfaces parallel to the optical axis A1, as with the second embodiment.

In the first annular region 330, a first fluorescent member 331a, a second fluorescent member 332a, a first fluorescent member 331b, and a second fluorescent member 332b are arranged in a rotationally symmetric manner about the optical axis A1. In the second annular region 340, a first fluorescent member 341a, a second fluorescent member 342a, a first fluorescent member 341b, and a second fluorescent member 342b are arranged in a rotationally symmetric manner about the optical axis A1. In the third annular region 350, a first fluorescent member 351a, a second fluorescent member 352a, a first fluorescent member 351b, and a second fluorescent member 352b are arranged in a rotationally symmetric manner about the optical axis A1.

In the first annular region 330, the first interface 333 and the second interface 334 between the fluorescent members are two planes that intersect on the optical axis A1 at an angle of 45 degrees, which are aggregates of straight lines parallel to the optical axis A1, like in the case of the second embodiment. In the second annular region 340 also, the first interface 343 and the second interface 344 between the fluorescent members are two planes that intersect on the optical axis A1 at an angle of 45 degrees, which are aggregates of straight lines parallel to the optical axis A1. In the third annular region 350 also, the first interface 353 and the second interface 354 between the fluorescent members are two planes that intersect on the optical axis A1 at an angle of 45 degrees, which are aggregates of straight lines parallel to the optical axis.

The first fluorescent members 331a, 331b, 341a, 341b, 351a, and 351b have the same construction and are made of a transparent material in which fluorescent particles are dispersed, as with the first fluorescent member 121 in the first embodiment. The second fluorescent members 332a, 332b, 342a, 342b, 352a, and 352b have the same construction and are made of a transparent material in which fluorescent particles are dispersed, as with the second fluorescent member 122 in the first embodiment.

The dividing surfaces in each annular region are arranged rotationally offset from the dividing surfaces in the internally adjacent annular region by 90 degrees about the optical axis A1. Specifically, the dividing surfaces including the first interface 343 and the second interface 344 in the second annular region 340 are rotationally offset from the divisional surfaces including the first interface 333 and the second interface 334 in the first annular region 330 internally adjacent to the second annular region 340 by 90 degrees about the optical axis A1, and the dividing surfaces including the first interface 353 and the second interface 354 in the third annular region 350 are rotationally offset from the divisional surfaces including the first interface 343 and the second interface 344 in the second annular region 340 internally adjacent to the third annular region 350 by 90 degrees about the optical axis A1. Therefore, the first interface 353 and the second interface 354 in the third annular region 350 are rotationally offset from the first interface 333 and the second interface 334 in the first annular region 330 by 180 degrees about the optical axis A1.

The purpose of arranging the dividing surfaces in each annular region in such a way as to be rotationally offset by 90 degrees from the dividing surfaces in the internally adjacent annular region is to space apart the fluorescent members of each type belonging to the same block before the rotational offset as much as possible to disperse the centers of emission of the blocks evenly on the plane perpendicular to the optical axis, thereby enhancing the degree of color mixture and reducing color variation (parallax).

If one annular region is rotationally offset from the inner annular region by 180 degrees, the distances between fluorescent members of the same type can be maximized. However, in the case of the wavelength conversion member according to the third embodiment, since the same type of fluorescent members are arranged at an angular cycle of 180 degrees about the optical axis A1 in each annular region, a rotational offset of 180 degrees makes fluorescent members of the same type to be located at the same position. In view of this, the annular regions are rotationally offset by 90 degrees, in the third embodiment. As above, it is preferred that an appropriate rotational offset angle be set in relation to the number of fluorescent members of the same type and the arrangement thereof.

[Operation]
As described above, as the first fluorescent members and the second fluorescent members are divisionally arranged with two interfaces in each annular region, the first fluorescent members and the second fluorescent members are arranged in twelve divisional regions in total, and the wavelength conversion member has two-fold rotational symmetry about the optical axis A1.

[Advantageous Effects]
With the above-described construction, the illumination apparatus according to the third embodiment can provide illumination light with good color balance, as with the illumination apparatus according to the first embodiment. Moreover, the above-described construction can reduce color variation (or parallax) of illumination light. The wavelength conversion member according to the third embodiment has a rotationally symmetric arrangement of fluorescent members, and the centers of light emission of the respective colors coincide with each other. Moreover, since the number of divisions of the fluorescent members is larger than that in the second embodiment, emitted fluorescent light has a higher degree of mixture, and the color balance (parallax) can be further improved as compared to the second embodiment.

The constructions, operations and advantages of the illumination apparatus according to the third embodiment other than described above are the same as those of the first embodiment.

Figure 13:
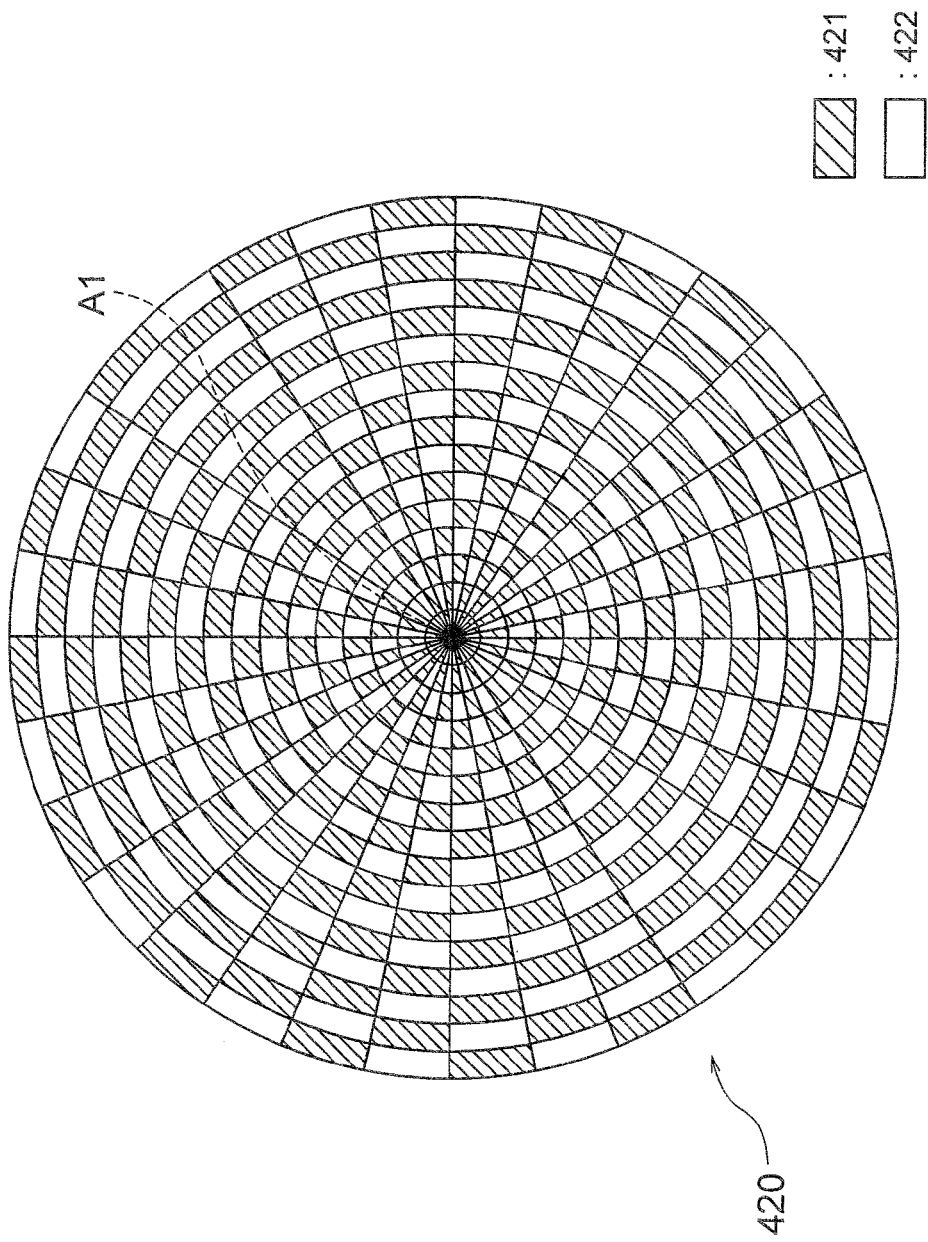
FIG. 13 is a plan view showing the construction of a wavelength conversion member according to a fourth embodiment.
Figure 14:
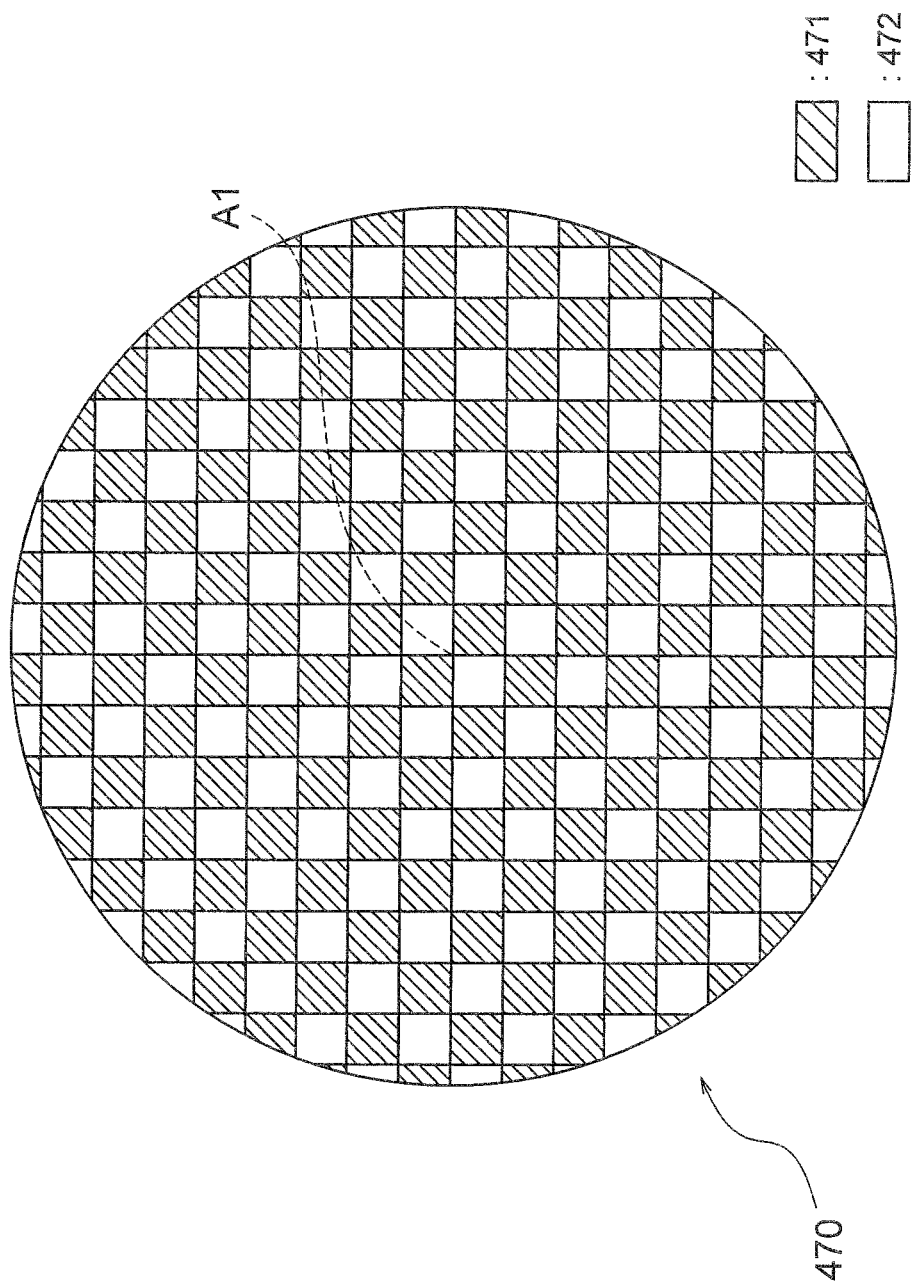
FIG. 14 is a plan view showing the construction of a wavelength conversion member according to a modification of the fourth embodiment.

(Fourth Embodiment)
[Construction]
An illumination apparatus according to a fourth embodiment will be described with reference to FIGS. 13 and 14. FIG. 13 is a plan view showing the construction of a wavelength conversion member 420 according to the fourth embodiment. FIG. 14 is a plan view showing the construction of a wavelength conversion member 470 according to a modification of the fourth embodiment. In the following, portions different from those in the illumination apparatus according to the first embodiment will be described, and similar portions will not be described.

The wavelength conversion member 420 shown in FIG. 13 has concentric annular regions having a center located at the center of the surface irradiated with excitation light existing on the optical axis A1. Each of the annular regions is divided into 32 regions in total by dividing surfaces, which are aggregates of straight lines parallel to the optical axis A1, as with the second and third embodiments, and first fluorescent members 421 and second fluorescent members 422 are alternately arranged in the respective regions. Thus, the wavelength conversion member 420 is divided into 32 regions both in the diametrical and circumferential directions and has 16-fold rotational symmetry about the optical axis A1.

The first fluorescent members 421 are made of a transparent material in which fluorescent particles are dispersed, as with the first fluorescent member 121 in the first embodiment. The second fluorescent members 422 are made of a transparent material in which fluorescent particles are dispersed, as with the second fluorescent member 122 in the first embodiment.

In the wavelength conversion member 470 shown in FIG. 14, first fluorescent members 471 and second fluorescent members 472 are arranged in a grid-like fashion in axial symmetry with respect to the optical axis A1.

The first fluorescent members 471 are made of a transparent material in which fluorescent particles are dispersed, as with the first fluorescent member 121 in the first embodiment. The second fluorescent members 472 are made of a transparent material in which fluorescent particles are dispersed, as with the second fluorescent member 122 in the first embodiment.

With the above-described construction, the illumination apparatus according to the fourth embodiment can provide illumination light with good color balance, as with the illumination apparatus according to the first embodiment. Moreover, the above-described construction can reduce color variation (or parallax) of illumination light.

The illumination apparatus according to the fourth embodiment has a rotationally symmetric arrangement of fluorescent members, and the centers of light emission of the respective colors coincide with each other. Moreover, since the number of divisions of the fluorescent members is larger than that in the third embodiment, emitted fluorescent light has a higher degree of mixture, and the color balance (parallax) can be further improved as compared to the third embodiment.

The constructions, operations and advantages of the illumination apparatus according to the fourth embodiment other than described above are the same as those of the first embodiment.

(Fifth Embodiment)
[Construction]

Figure 15:
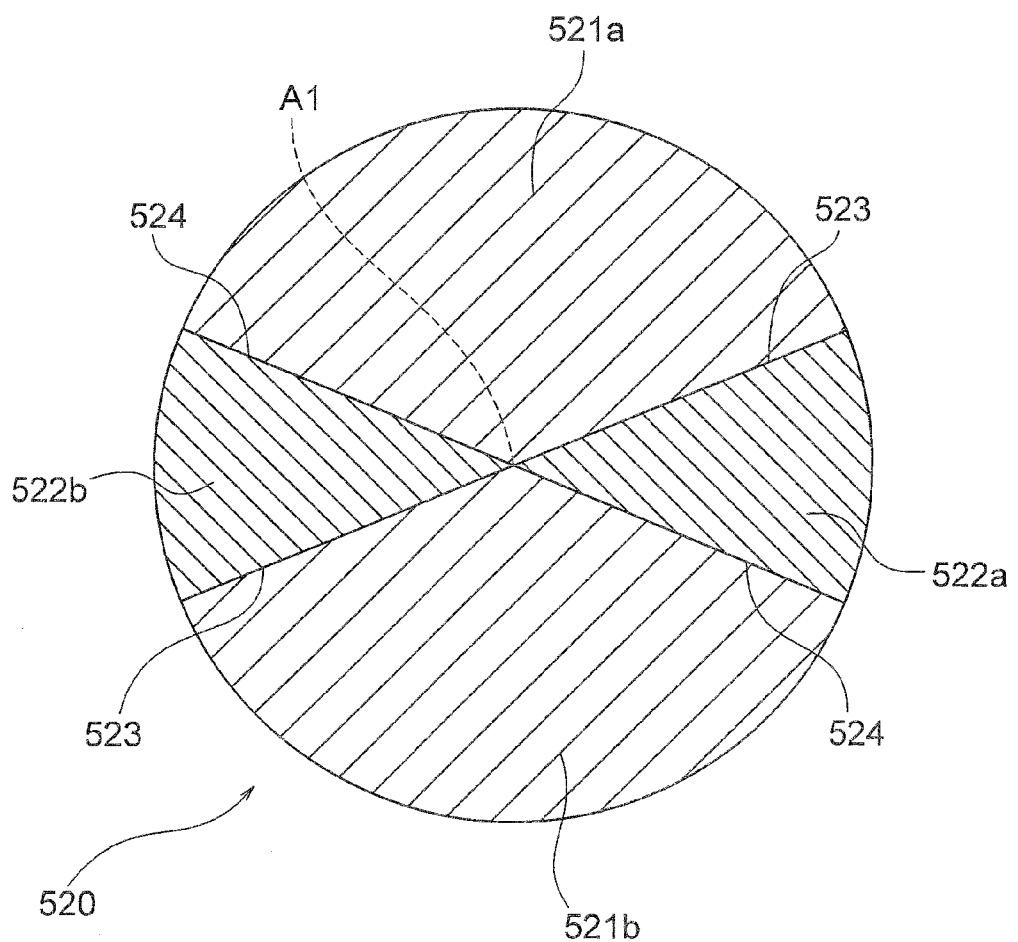
FIG. 15 is a cross sectional view of a wavelength conversion member according to a fifth embodiment, taken on an arbitrary plane perpendicular to the optical axis.
Figure 16:
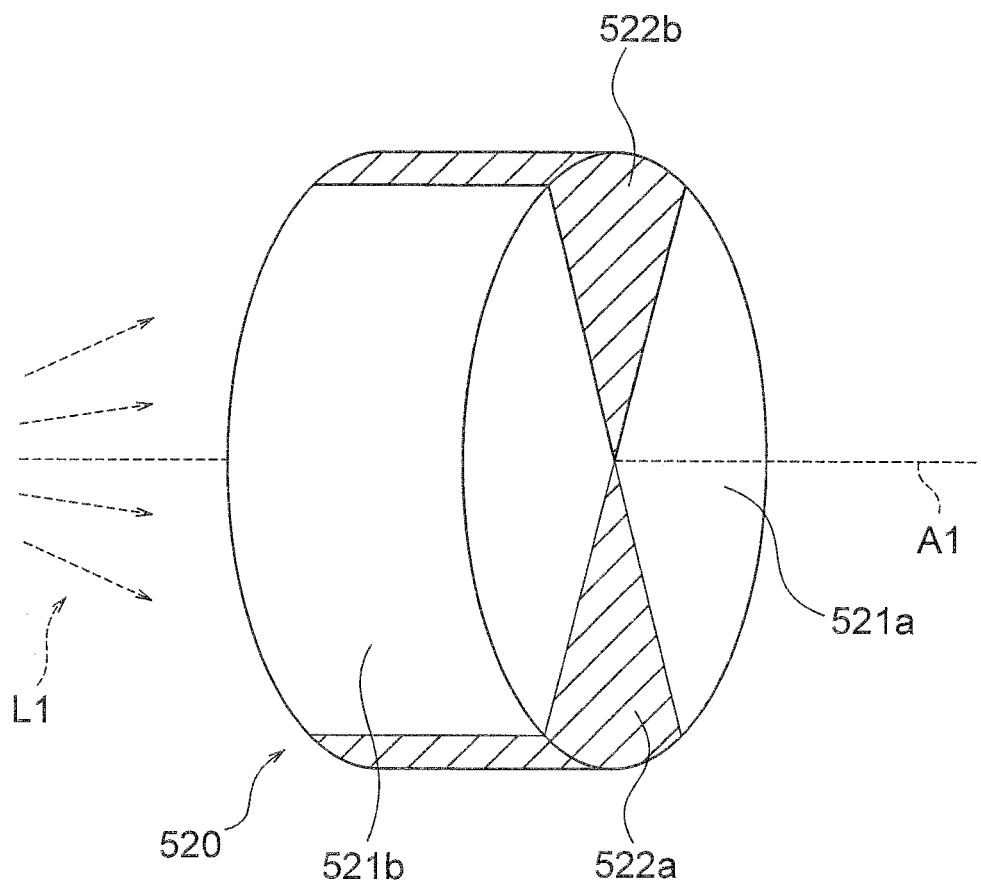
FIG. 16 is a perspective view of the wavelength conversion member according to the fifth embodiment.
Figure 17:
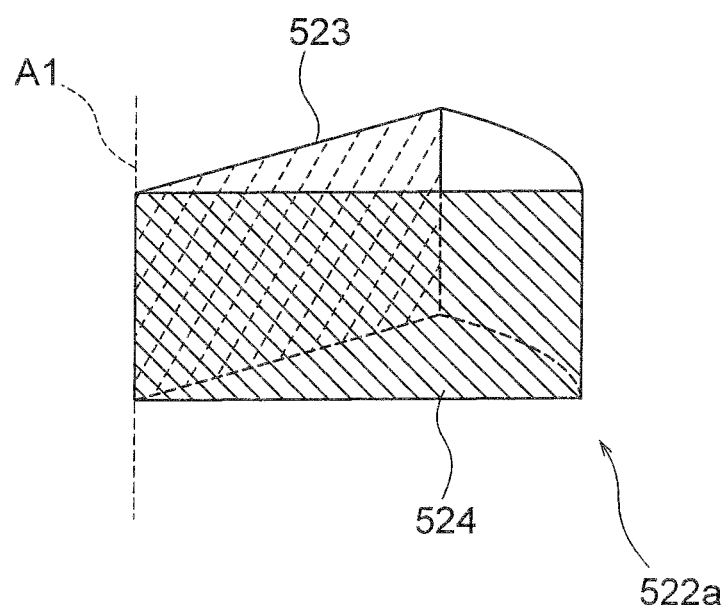
FIG. 17 is a perspective view showing only one second fluorescent member in the wavelength conversion member according to the fifth embodiment.

An illumination apparatus according to a fifth embodiment will be described with reference to FIGS. 15, 16, and 17. FIG. 15 is a cross sectional view of a wavelength conversion member 520 according to the fifth embodiment, taken on an arbitrary plane perpendicular to the optical axis A1. FIG. 16 is a perspective view of the wavelength conversion member 520 according to the fifth embodiment. FIG. 17 is a perspective view showing only one second fluorescent member 522a in the wavelength conversion member 520 according to the fifth embodiment. In the following, portions different from those in the illumination apparatus according to the first embodiment will be described, and similar portions will not be described.

In the wavelength conversion member 520 according to the fifth embodiment, a first fluorescent member 521a, a second fluorescent member 522a, a first fluorescent member 521b and a second fluorescent member 522b are arranged in a rotationally symmetric manner about the optical axis A1.

The interface between the first fluorescent member 521a and the second fluorescent member 522a and the interface between the first fluorescent member 521b and the second fluorescent member 522b constitute a common first interface 523. The interface between the first fluorescent member 521b and the second fluorescent member 522a and the interface between the first fluorescent member 521a and the second fluorescent member 522b constitute a common second interface 524. The first interface 523 and the second interface 524 are two planes that intersect on the optical axis A1 at an angle of 45 degrees. The first interface 523 and the second interface 524 are aggregates of straight lines parallel to the optical axis A1. Reflectors that prevent the transmission of first fluorescent light and second fluorescent light are provided on the first interface 523 and the second interface 524.

The first fluorescent members 521a and 521b have the same construction and are made of a transparent material in which fluorescent particles are dispersed, as with the first fluorescent member 121 in the first embodiment. The second fluorescent members 522a and 522b have the same construction and are made of a transparent material in which fluorescent particles are dispersed, as with the second fluorescent member 122 in the first embodiment.

The first fluorescent member and the second fluorescent member are excited by excitation light of the same wavelength and emit fluorescent light of different wavelengths. It is assumed in this embodiment that the second fluorescent light has a peak wavelength longer than that of the first fluorescent light. Generally in a system in which fluorescent members that convert light into light of different wavelengths are arranged side by side, a phenomenon called secondary absorption in which the second fluorescent member absorbs the first fluorescent light at a certain rate occurs. On the other hand, the first fluorescent member absorbs the second fluorescent light little. In consequence, color balance is deteriorated. In the wavelength conversion member 520 according to the fifth embodiment, the secondary absorption can be prevented by the provision of the reflectors that prevent the transmission of the first fluorescent light and the second fluorescent light on the first interface 523 and the second interface 524. In consequence, deterioration of color balance can be prevented.

Specifically, the provision of the reflectors prevents fluorescent light generated in one fluorescent light from entering other fluorescent members. Therefore, deterioration of color balance due to secondary absorption can be prevented. The reflectors can prevent secondary absorption from occurring if they can reflect at least the first fluorescent light that has a shorter wavelength. Provided only on the interfaces, the reflectors do not affect the entrance of the excitation light L1 into the wavelength conversion member 520 or the emission of the fluorescent light from the wavelength conversion member 520. Moreover, since the provision of the reflectors prevents secondary absorption by fluorescent members, the light utilization efficiency can be enhanced, and the loss of light and heat generated in the florescent members can be reduced.

An exemplary method of providing the reflection is to use as the first fluorescent member a material having a higher refractive index than the second fluorescent member. With the use of such a material, the interfaces between the two types of fluorescent members will have a certain reflecting function. In particular, the first fluorescent light is apt not to enter the second fluorescent member, because light traveling from a member having a higher refractive index toward a member having a lower refractive index is reflected at a reflectance higher than light traveling in the reverse direction.

Another exemplary method of providing the reflection is to fill a space at the interface of the two types of fluorescent members with a material having a low refractive index. For example, if a space at the interface is filled with a transparent material having a low refractive index such as a silicone, the interface will have a certain reflecting function. Besides a silicone, examples of the material having a low refractive index include an air layer. Because the air has the lowest refractive index, it provides a high reflectance and contributes greatly to the enhancement of the brightness of the illumination light.

A plurality of materials may be provided in layers on the interface between the two types of fluorescent members. For example, a dielectric multi-layer film having a thickness and reflective index determined taking into consideration interface conditions may be used. This enables the interface to have the selective reflecting function to reflect only the first fluorescent light. Alternatively, thin metal films may be provided on surface other than the interface between the two types of fluorescent members and stacked.

[Advantageous Effects]

The above-described construction enables easier setting of color balance. If the reflectors like those in the fifth embodiment are not provided, color balance will be shifted from the intended balance closer to the second fluorescent light due to secondary absorption properties. In the case where reflectors are provided on the interfaces, as is the case with the wavelength conversion member according to the fifth embodiment, secondary absorption can be prevented from occurring, and illumination light having color balance as designed can be emitted.

The constructions, operations and advantages of the illumination apparatus according to the fifth embodiment other than described above are the same as those of the first embodiment.

[Sixth Embodiment]

Figure 18:
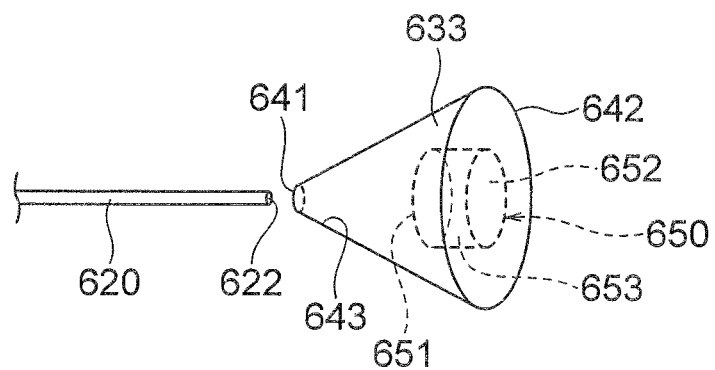
FIG. 18 is a perspective view showing the construction of a wavelength conversion member and a light guide member according to a sixth embodiment.
Figure 19:
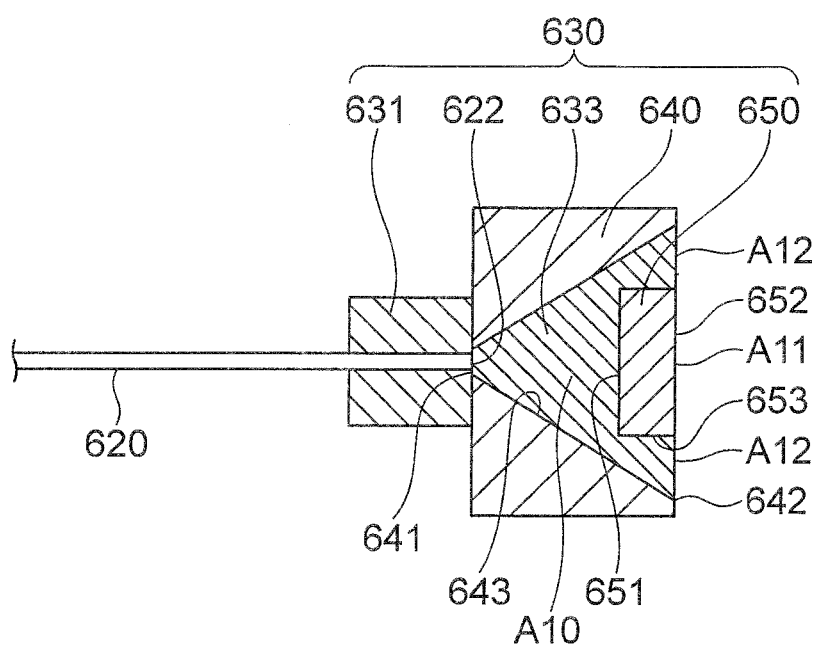
FIG. 19 is a cross sectional view showing the construction of the wavelength conversion member and the light guide member according to a sixth embodiment.
Figure 20:
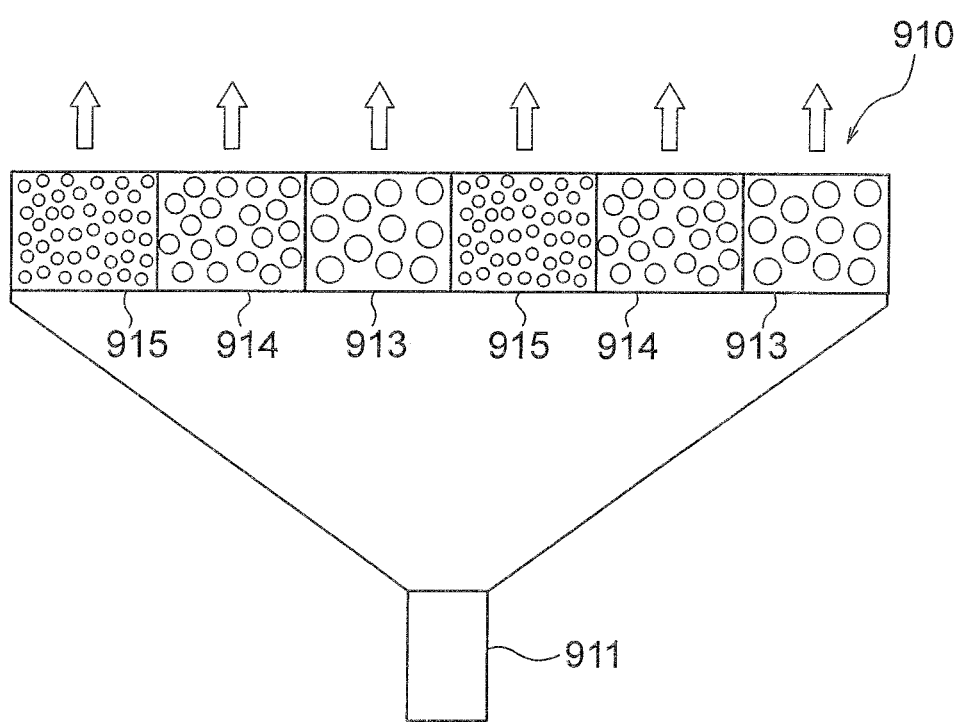
FIG. 20 is a side view illustrating the construction of a conventional illumination apparatus.
Figure 21:
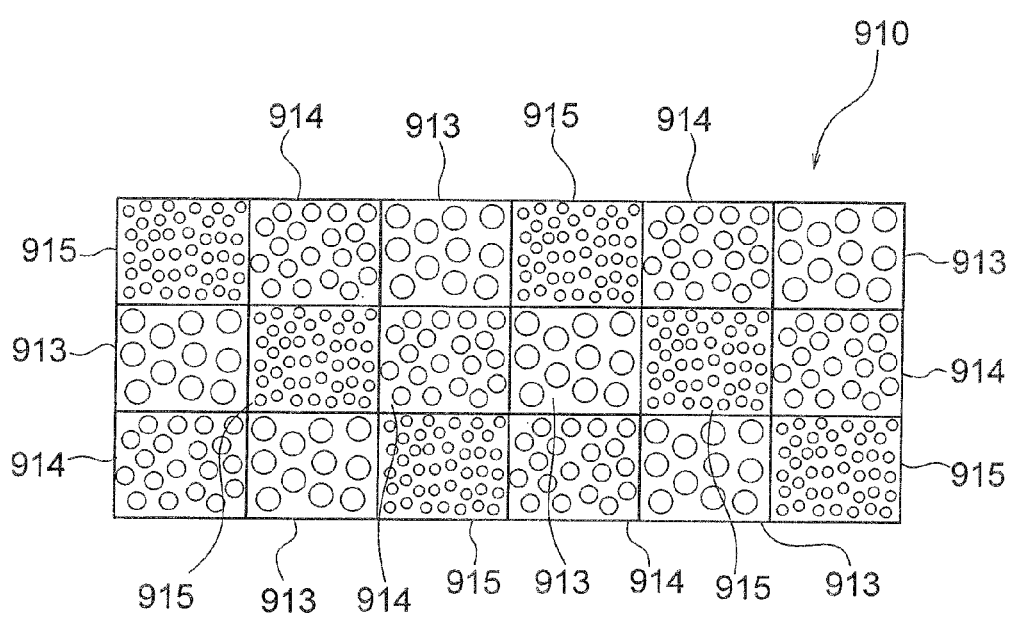
FIG. 21 is a plan view of the illumination apparatus shown in FIG. 20.

FIG. 18 is a perspective view showing the construction of a wavelength conversion member and a light guide member according to a sixth embodiment. FIG. 19 is a cross sectional view showing the construction of the wavelength conversion member and the light guide member according to a sixth embodiment.

As the wavelength conversion member 650 in the sixth embodiment, any one of the wavelength conversion members according to the above-described embodiments is used.

A wavelength conversion unit 630 includes an exit end 622 of the light guide member 620, the wavelength conversion member 650, a light transmitting member 633, a holder 640, and a ferrule 631 and converts excitation light guided by the light guide member 620 into desired light having a converted wavelength by wavelength conversion.

The wavelength conversion member 650 has a cylindrical shape with a first surface 651 facing the excitation light exit end 622 of the light guide member 620, a second surface 652 opposed to the first surface 651, and a side surface 653 between the first surface 651 and the second surface 652. The first surface 651 is spaced apart from the excitation light exit end 622.

The outer circumference of the exit end 622 of the light guide member 620 is held by the ferrule 631, and the exit end 622 is connected in such a way that excitation light enters an entrance opening 641 of the holder 640.

The second surface 652 of the cylindrical wavelength conversion member 650 is smaller in area than an exit opening 642 of the holder 640 and arranged substantially concentrically with the exit opening 642 of the holder 640. With this arrangement, the wavelength conversion member 650 is prevented from being in contact with the inner surface of a through-bore of the holder 640. In other words, the second surface 652 is arranged in such a way as to be spaced apart, all along its circumference, from the holder's exit opening 642 which constitutes the end of a reflector 643. The second surface 652 partly constitutes the open face of the holder's exit opening 642. The thickness of the wavelength conversion member 650 is designed to be large enough to fulfill sufficient wavelength conversion of the excitation light.

Here, the area occupied by the second surface 652 in the area of the holder's exit opening 642 is referred to as a first area A11 (see FIG. 19), and the remaining area in the holder's exit opening 642 is referred to as a second area A12 (see FIG. 19). The light transmitting member 633 is provided with a wavelength-converted light propagation region A10 extending continuously from the excitation light exit end 622 of the light guide member 620 to the second area A12, for causing wavelength-converted light having been reflected by the reflector 643 at least once to exit from the second area A12.

Industrial Applicability

The illumination apparatus according to the present invention is useful as an illumination apparatus that needs color balance setting of a white light source.

DESCRIPTION OF REFERENCE SIGNS

110: light source
111: emitting area
120: wavelength conversion member
120a: first surface (surface irradiated with excitation light)
120b: second surface
121: first fluorescent member
122: second fluorescent member
123: dividing surface (interface)
124: dividing surface (interface)
130: fixing member
150: wavelength conversion member
150a: first surface (surface irradiated with excitation light)
150b: second surface
151: first fluorescent member
152: second fluorescent member
153: dividing surface (interface)
154: dividing surface (interface)
180: wavelength conversion member
180a: first surface (surface irradiated with excitation light)
180b: second surface
181: first fluorescent member
182: second fluorescent member
183: dividing surface (interface)
184: dividing surface (interface)
190: wavelength conversion member
191: first fluorescent member
192: second fluorescent member
193: third fluorescent member
220: wavelength conversion member
221a: first fluorescent member
221b: first fluorescent member
222a: second fluorescent member
222b: second fluorescent member
223: first interface
224: second interface
250: wavelength conversion member 251a: first fluorescent member
251b: first fluorescent member
251c: first fluorescent member
251d: first fluorescent member
252a: second fluorescent member
252b: second fluorescent member
252c: second fluorescent member
252d: second fluorescent member
253: first interface
254: second interface
255: third interface
256: fourth interface
280: wavelength conversion member
281a: first fluorescent member
281b: first fluorescent member
281c: first fluorescent member
281d: first fluorescent member
282a: second fluorescent member
282b: second fluorescent member
282c: second fluorescent member
282d: second fluorescent member
283a: third fluorescent member
283b: third fluorescent member
283c: third fluorescent member
283d: third fluorescent member
320: wavelength conversion member
330: first annular region
331a: first fluorescent member
331b: first fluorescent member
332a: second fluorescent member
332b: second fluorescent member
333: first interface
334: second interface
340: second annular region
341a: first fluorescent member
341b: first fluorescent member
342a: second fluorescent member
342b: second fluorescent member
343: first interface
344: second interface
350: third annular region
351a: first fluorescent member
351b: first fluorescent member
352a: second fluorescent member
352b: second fluorescent member
353: first interface
354: second interface
420: wavelength conversion member
421: first fluorescent member
422: second fluorescent member
470: wavelength conversion member
471: first fluorescent member
472: second fluorescent member
520: wavelength conversion member
521a: first fluorescent member
521b: first fluorescent member
522a: second fluorescent member
522b: second fluorescent member
523: first interface
524: second interface
620: light guide member
622: exit end
630: wavelength conversion unit
631: ferrule
633: light transmitting member
640: holder
641: holder's entrance opening
642: holder's exit opening
650: wavelength conversion member
651: first surface
652: second surface
653: side surface

What is claimed is:

1. An illumination apparatus comprising:
an excitation light source configured to emit an excitation light, wherein a direction in which the excitation light is emitted at the highest intensity defines an optical axis; and
a wavelength converter arranged downstream from the excitation light source in the direction in which the excitation light is emitted, the wavelength converter comprising:
a first fluorescent member configured to absorb at least a portion of the excitation light and to emit a first fluorescent light different from the excitation light; and
a second fluorescent member configured to absorb at least a portion of the excitation light and to emit a second fluorescent light different from the excitation light,
wherein:
the wavelength converter has a cross-section that is substantially circular and substantially perpendicular to the optical axis,
a center axis of the wavelength converter that passes through the center of the cross-section substantially coincides with the optical axis, and
in a concentric annular region of the cross-section, the concentric annular region being defined between a first circle that is substantially centered on the optical axis and has a first radius, and a second circle that is substantially concentric to the first circle and has a second radius of a predetermined value, a ratio between:
a first area occupied by the first fluorescent member in the concentric annular region, and
a second area occupied by the second fluorescent member in the concentric annular region,
is substantially constant irrespective of a value of the first radius.

2. The illumination apparatus according to claim 1, wherein the first fluorescent member is adjacent to the second fluorescent member, and an interface between the first fluorescent member and the second fluorescent member is arranged on a plane.

3. The illumination apparatus according to claim 2,
wherein a first surface of the first fluorescent member at the interface is a flat surface and a first surface of the second fluorescent member at the interface is a flat surface,
wherein a second surface of the first fluorescent member extending away from the first surface of the first fluorescent member is a curved surface constituted by an aggregate of straight lines parallel to and equidistant from the optical axis, and
wherein a second surface of the second fluorescent member extending away from the first surface of the second fluorescent member is a curved surface constituted by an aggregate of straight lines parallel to and equidistant from the optical axis.

4. The illumination apparatus according to claim 1, wherein the first fluorescent member and the second fluorescent member are arranged to have rotational symmetry about the optical axis.

5. An illumination apparatus comprising:
an excitation light source configured to emit an excitation light, wherein a direction in which the excitation light is emitted at the highest intensity defines an optical axis; and
a wavelength converter arranged downstream from the excitation light source in the direction in which the excitation light is emitted, the wavelength converter comprising:
a first fluorescent material configured to absorb at least a portion of the excitation light and to emit a first fluorescent light different from the excitation light; and
a second fluorescent material configured to absorb at least a portion of the excitation light and to emit a second fluorescent light different from the excitation light,
wherein:
the wavelength converter has a cross-section that is substantially circular and substantially perpendicular to the optical axis,
a center axis of the wavelength converter that passes through the center of the cross-section substantially coincides with the optical axis, and
in a concentric annular region of the cross-section, the concentric annular region being defined between a first circle that is substantially centered on the optical axis and has a first radius, and a second circle that is substantially concentric to the first circle and has a second radius of a predetermined value, a ratio between:
a first area occupied by the first fluorescent material in the concentric annular region, and
a second area occupied by the second fluorescent material in the concentric annular region,
is substantially constant irrespective of a value of the first radius.

6. The illumination apparatus according to claim 5, wherein the first fluorescent material and the second fluorescent material are provided as a plurality of fluorescent members, and
wherein all interfaces between two of the plurality of fluorescent members, the two of the plurality of fluorescent members being adjacent to each other, are one of a curved surface or a flat surface, each of the curved surface and the flat surface being constituted by aggregates of straight lines parallel to the optical axis.

7. The illumination apparatus according to claim 6, wherein the straight lines constituting the curved surface are equidistant from the optical axis, and
wherein the flat surface is provided on a plane that contains the optical axis.

8. The illumination apparatus according to claim 6, wherein the plurality of fluorescent members are arranged to have two-fold or more rotational symmetry about the optical axis.

9. The illumination apparatus according to claim 8, wherein the plurality of fluorescent members are arranged within a plurality of annular regions defined by a plurality of cylindrical interfaces concentric about the optical axis.

10. The illumination apparatus according to claim 9, wherein the plurality of annular regions comprise a first annular region and a second annular region internally adjacent to the first annular region, and
wherein interfaces between adjacent fluorescent members in the first annular region are rotationally offset from interfaces between adjacent fluorescent members in the second annular region by 90 degrees or 180 degrees.

11. The illumination apparatus according to claim 6, further comprising a material provided at the interfaces between adjacent ones of the plurality of fluorescent members, wherein the material reflects one or more of the first fluorescent light and the second fluorescent light.

12. The illumination apparatus according to claim 11, wherein the material comprises one or more of:
a metal reflecting film,
a thin film layer having a refractive index lower than the refractive index of the first fluorescent member and the refractive index of the second fluorescent member, and
a dielectric multi-layer film.

13. The illumination apparatus according to claim 5, wherein the cross-section of the wavelength converter is an incident surface on which the excitation light is incident.

14. The illumination apparatus according to claim 5, wherein the cross-section of the wavelength converter is an emitting surface from which excitation light is emitted.

15. The illumination apparatus according to claim 5, wherein the value of the first radius is larger than the predetermined value of the second radius.

16. The illumination apparatus according to claim 5, wherein the value of the first radius is smaller than the predetermined value of the second radius.

17. An illumination apparatus comprising:
an excitation light source configured to emit an excitation light, wherein a direction in which the excitation light is emitted at the highest intensity defines an optical axis; and
a wavelength converter arranged downstream from the excitation light source in the direction in which the excitation light is emitted, the wavelength converter comprising:
a first fluorescent material configured to absorb at least a portion of the excitation light and to emit a first fluorescent light different from the excitation light; and
a second fluorescent material configured to absorb at least a portion of the excitation light and to emit a second fluorescent light different from the excitation light,
wherein:
the wavelength converter has a cross-section that is substantially circular and substantially perpendicular to the optical axis,
a center axis of the wavelength converter that passes through the center of the cross-section substantially coincides with the optical axis, and
in a portion of the cross-section, the portion being substantially circular and substantially centered on the optical axis, a ratio between:
a first area occupied by the first fluorescent material in the portion, and
a second area occupied by the second fluorescent material in the portion,
is substantially constant irrespective of the radius of the portion.

18. The illumination apparatus according to claim 17, wherein the first fluorescent material and the second fluorescent material are provided as a plurality of fluorescent members, and
wherein all interfaces between two of the plurality of fluorescent members, the two of the plurality of fluorescent members being adjacent to each other, are one of a curved surface or a flat surface, each of the curved surface and the flat surface being constituted by aggregates of straight lines parallel to the optical axis.

19. The illumination apparatus according to claim 18,
wherein the straight lines constituting the curved surface are equidistant from the optical axis, and
wherein the flat surface is provided on a plane that contains the optical axis.

20. The illumination apparatus according to claim 18, wherein the plurality of fluorescent members are arranged to have two-fold or more rotational symmetry about the optical axis.

21. The illumination apparatus according to claim 20, wherein the plurality of fluorescent members are arranged within a plurality of annular regions defined by a plurality of cylindrical interfaces concentric about the optical axis.

22. The illumination apparatus according to claim 21,
wherein the plurality of annular regions comprise a first annular region and a second annular region internally adjacent to the first annular region, and
wherein interfaces between adjacent fluorescent members in the first annular region are rotationally offset from interfaces between adjacent fluorescent members in the second annular region by 90 degrees or 180 degrees.

23. The illumination apparatus according to claim 18, further comprising a material provided at the interfaces between adjacent ones of the plurality of fluorescent members, wherein the material reflects one or more of the first fluorescent light and the second fluorescent light.

24. The illumination apparatus according to claim 23, wherein the material comprises one or more of:
a metal reflecting film,
a thin film layer having a refractive index lower than the refractive index of the first fluorescent member and the refractive index of the second fluorescent member, and
a dielectric multi-layer film.

25. The illumination apparatus according to claim 17, wherein the cross-section of the wavelength converter is an incident surface on which the excitation light is incident.

26. The illumination apparatus according to claim 17, wherein the cross-section of the wavelength converter is an emitting surface from which excitation light is emitted.

\* \* \* \* \*